United States Patent
Maeda

(10) Patent No.: US 7,595,702 B2
(45) Date of Patent: Sep. 29, 2009

(54) MODULATION APPARATUS CAPABLE OF CORRECTING NON-LINEARITY OF VOLTAGE CONTROLLED OSCILLATOR

(75) Inventor: Masakatsu Maeda, Kyoto (JP)

(73) Assignee: Panasonic Corporation, Osaka (JP)

( * ) Notice: Subject to any disclaimer, the term of this patent is extended or adjusted under 35 U.S.C. 154(b) by 148 days.

(21) Appl. No.: 11/822,369

(22) Filed: Jul. 5, 2007

(65) Prior Publication Data

US 2009/0010372 A1 Jan. 8, 2009

(51) Int. Cl.
*H04L 27/20* (2006.01)
(52) U.S. Cl. .................. 332/103; 332/144; 375/308
(58) Field of Classification Search .............. 332/103, 332/144, 145; 375/308
See application file for complete search history.

(56) References Cited

U.S. PATENT DOCUMENTS 7,323,944 B2 * 1/2008 Florescu et al. ............. 331/14
2007/0036238 A1 * 2/2007 Matero et al. ............... 375/296

FOREIGN PATENT DOCUMENTS

JP 7-55924 3/1995
JP 10-115677 5/1998

OTHER PUBLICATIONS

Oshima et al., "Simple Polar-Loop Transmitter For Dual-Mode Blue Tooth", *IEEE International Symposium*, vol. 4, pp. 3966-3969, May 2005.

* cited by examiner

*Primary Examiner*—Robert Pascal
*Assistant Examiner*—James E Goodley
(74) *Attorney, Agent, or Firm*—Wenderoth, Lind & Ponack

(57) ABSTRACT

A modulation apparatus 24 comprises a monitoring section 207 operable to monitor information about a control voltage applied to a VCO 201 as control voltage information, during any period, when a low-frequency signal having a frequency within a loop band of a PLL circuit is input at least before an LPF 209, a correction table storing section 206 operable to associate the control voltage information monitored by the monitoring section 207 as information about a control voltage after correction with information about a control voltage before correction, and store the associated information as a correction table, and a correction section 204 operable to correct a control voltage applied to the VCO 201 based on the correction table stored in the correction table storing section.

16 Claims, 23 Drawing Sheets

F I G. 1
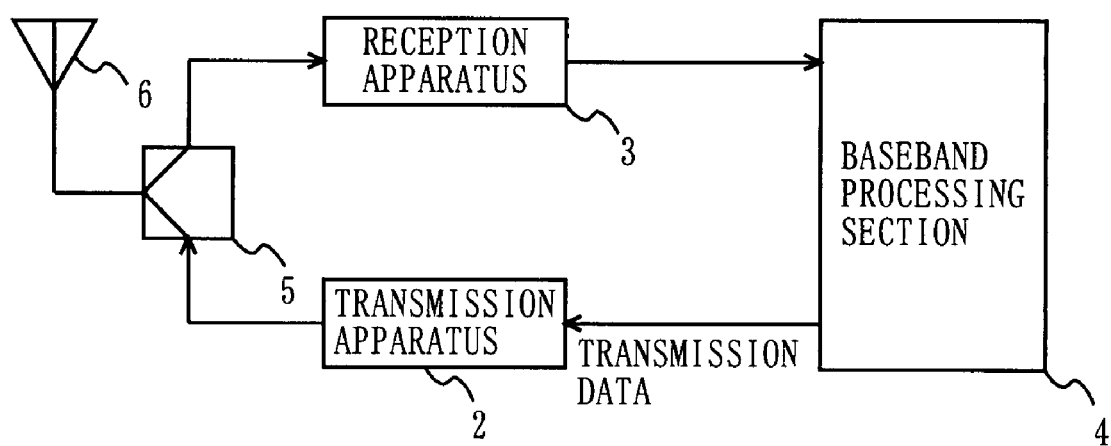

FIG. 7

| CORRECTION TABLE ||
|---|---|
| DIGITAL VALUE OF CONTROL VOLTAGE INFORMATION BEFORE CORRECTION | DIGITAL VALUE OF CONTROL VOLTAGE INFORMATION AFTER CORRECTION |
| D1 | Dc1 |
| D2 | Dc2 |
| ... | ... |

MODULATION APPARATUS CAPABLE OF CORRECTING NON-LINEARITY OF VOLTAGE CONTROLLED OSCILLATOR

BACKGROUND OF THE INVENTION

1. Field of the Invention

The present invention relates to a modulation apparatus for performing phase modulation using a PLL (Phase-Locked-Loop) circuit. More particularly, the present invention relates to a modulation apparatus capable of correcting the non-linearity of a voltage controlled oscillator used in a PLL circuit.

2. Description of the Background Art

A polar modulation system is one of wireless communications systems which perform phase modulation using a PLL circuit. FIG. 20 is a block diagram showing an exemplary functional configuration of a polar modulation apparatus 900 used in a transmission apparatus of a conventional polar modulation system. See FIG. 1 of "SIMPLE POLAR-LOOP TRANSMITTER FOR DUAL-MODE BLUETOOTH", Takashi Oshima and Masaru Kokubo, Hitachi Ltd., Central Research Laboratory, Circuits and Systems, 2005. ISCAS 2005. IEEE International Symposium on 23-26 May 2005 Page(s):3966-3969 Vol. 4 (Non-Patent Document 1).

In FIG. 20, the polar modulation apparatus 900 comprises an I/Q conversion section 901, a polar conversion section 902, an AM modulation section 903, a PM modulation section 904, and a power amplifier (PA) 905. Transmission data containing information to be transmitted is input to the I/Q conversion section 901. The I/Q conversion section 901 converts the transmission data into an in-phase component and a quadrature component and outputs these components as a digital I signal and Q signal. The polar conversion section 902 converts the I and Q signals output by the I/Q conversion section 901 into an amplitude component and a phase component in a polar coordinate system and outputs these components as a digital amplitude signal R and a phase signal $\theta$. The AM modulation section 903 converts the amplitude signal R into an analog value and inputs the analog value to the PA 905. The PM modulation section 904 comprises a PLL circuit including a voltage controlled oscillator, and changes a phase of an output signal of the voltage controlled oscillator based on the phase signal $\theta$ and inputs the phase-modulated signal to the PA 905. The PA 905 modulates an amplitude of the signal output from the PM modulation section 904 based on the signal output from the AM modulation section 903 and outputs the resultant transmission signal to an antenna. Thereby, the transmission data is polar-modulated and is then transmitted from the antenna.

To achieve a broad band in the PM modulation section 904, a system called a two-point modulation method has been proposed. FIG. 21 is a diagram showing a detailed exemplary configuration of the conventional PM modulation section 904 employing the two-point modulation method. See FIG. 2 of Non-Patent Document 1. In FIG. 21, the PM modulation section 904 comprises a phase comparator (PFD) 906, a charge pump (CP) 907, a low-pass filter (LPF) 908, a voltage controlled oscillator (VCO) 909, a frequency divider (1/N) 910, a $\Sigma\Delta$ converter 911, a digital analog converter (DAC) 912, a differentiator (d/dt) 913, and an adder 914.

The phase comparator 906, the charge pump 907, the low-pass filter 908, the voltage controlled oscillator 909, and the frequency divider 910 constitute a PLL circuit. In the two-point modulation method, a frequency division ratio of the frequency divider 910 is changed based on the phase signal $\theta$, and a control voltage applied to the voltage controlled oscillator 909 is changed based on the phase signal $\theta$. Thus, in the two-point modulation method, a signal propagating through the PLL circuit is changed between before and after the low-pass filter 908.

The phase signal $\theta$ is differentiated by the differentiator 913 and is converted into a $\Sigma\Delta$-converted analog signal by the $\Sigma\Delta$ converter 911 and the $\Sigma\Delta$-converted analog signal is then input as a signal IN1($t$) to the frequency divider 910. Phase modulation is achieved by modulating the frequency division ratio using the signal IN1($t$). It is known that a frequency response from an input of the frequency divider 910 to an output of the voltage controlled oscillator 909 is a low-pass response (see expression (1) in Non-Patent Document 1).

On the other hand, the phase signal $\theta$ which has been converted into an analog signal by the digital-analog converter 912 is input as a signal IN2($t$) to the adder 914. Phase modulation is also achieved by modulating the control voltage using the signal IN2($t$). It is known that a frequency response from a control terminal to an output of the voltage controlled oscillator 909 is a high-pass response (see expression (3) in Non-Patent Document 1).

Thus, when the two-point modulation method is used, a combination of phase modulations having a low-pass response and a high-pass response can be provided before and after the low-pass filter 908, thereby achieving a broad-band phase modulation in the PM modulation section 904.

As described above, it is known that, when the two-point modulation method is used, broad-band phase modulation is achieved. However, the voltage controlled oscillator in the PLL circuit often has non-linearity. Therefore, when a non-linear voltage controlled oscillator is used, a distortion is likely to occur in an output, so that desired phase modulation may not be achieved. Therefore, even when the two-point modulation method is used, the problem with the non-linearity of the voltage controlled oscillator needs to be solved.

The non-linearity of the voltage controlled oscillator sometimes causes a problem. For example, Japanese Patent Laid-Open Publication No. 7-55924 (Patent Document 1) and Japanese Patent Laid-Open Publication No. 10-115677 (Patent Document 2) disclose inventions which solve the non-linearity of the voltage controlled oscillator. Specifically, Patent Documents 1 and 2 propose a technique of calculating characteristics inverse to the non-linear characteristics of the voltage controlled oscillator, and based on the obtained inverse characteristics, correcting the control voltage.

FIGS. 22A to 22C are diagrams for describing the conventional technique of calculating the inverse characteristics of the voltage controlled oscillator and correcting a control voltage. As shown in FIG. 22A, the voltage controlled oscillator is assumed to have characteristics A1 as characteristics of an output frequency with respect to a control voltage. The characteristics A1 are non-linear. In this case, if the control voltage is changed in accordance with a sine curve, the output frequency is distorted. Therefore, in the conventional correction technique, as shown in FIG. 22B, an inverse function of the characteristics A1 is calculated as inverse characteristics IA1. In this case, a voltage controlled oscillator having the inverse characteristics IA1 is assumed, and characteristics of a distorted output frequency obtained when a sine curve is input are calculated as characteristics B1 of a control voltage after correction. A control voltage before correction is associated with a control voltage after correction as shown in FIG. 22B, thereby correcting a control voltage. For example, as shown in FIG. 22C, when a sine-curve variation is provided as a control voltage before correction, then if the characteristics B1 are used as variations in a control voltage after correction, a sine curve having no distortion is output from the voltage controlled oscillator.

However, when the technique of calculating the inverse characteristics of the voltage controlled oscillator to correct a control voltage is employed, an advanced digital signal processing technique capable of achieving a Fourier transform is required to calculate the inverse characteristics of the voltage controlled oscillator, for example.

Also, the correction of the non-linearity of the voltage controlled oscillator largely relates to modulation of a transmission signal, and it is necessary to remove a distortion of the voltage controlled oscillator more quickly. However, when the advanced digital signal processing technique is used to correct the non-linearity of the voltage controlled oscillator, it is difficult to achieve the correction quickly. When the digital signal processing technique is used, a problem inevitably arises with cost.

Even when the inverse characteristics of the voltage controlled oscillator are previously obtained, the non-linearity can be corrected. However, the characteristics of the voltage controlled oscillator vary over time. If the inverse characteristics are fixed, a deterioration disadvantageously occurs in communications quality.

SUMMARY OF THE INVENTION

Therefore, an object of the present invention is to provide a modulation apparatus capable of simply and quickly correcting the non-linearity of a voltage controlled oscillator without using an advanced digital signal processing technique, and a transmission apparatus and a communication terminal which comprise the modulation apparatus.

The present invention has the following features to attain the object mentioned above. The present invention provides a modulation apparatus for modulating a phase of an output signal output from a voltage controlled oscillator by changing a signal transmitted through a PLL circuit, before and after a low-pass filter in the PLL circuit, comprising a monitoring section operable to monitor information about a control voltage applied to the voltage controlled oscillator as control voltage information, during any period, when a low-frequency signal having a frequency within a loop band of the PLL circuit is input at least before the low-pass filter, a correction table storing section operable to associate the control voltage information monitored by the monitoring section as information about a control voltage after correction with information about a control voltage before correction, and store the associated information as a correction table, and a correction section operable to correct a control voltage applied to the voltage controlled oscillator based on the correction table stored in the correction table storing section.

Preferably, the correction table is produced when the PLL circuit is in a locked state. Thereby, the correction table is produced before transmission, thereby making it possible to achieve high-quality transmission.

Also, preferably, the PLL circuit is a digital PLL circuit. The modulation apparatus further comprises a test signal generating section operable to output a digital test signal as the low-frequency signal, during a predetermined period, when the PLL circuit is in the locked state. The monitoring section monitors a digital value of the control voltage information during any period in which the test signal is being output. The correction table storing section stores the correction table in which the digital value monitored by the monitoring section is information about a control voltage after correction and a digital value obtained by adding a digital value of a channel signal to a digital value of the test signal is information about a control voltage before correction.

Also, preferably, the digital value of the test signal is changed so that a signal in a frequency band used for modulation is output by the voltage controlled oscillator. Thereby, a correction table for correcting a control voltage of a voltage controlled oscillator is obtained over a whole frequency band used for modulation, thereby making it possible to achieve high-quality transmission.

Also, preferably, the correction table may be produced during a period in which transmission is being performed. Thereby, a correction table is produced even during transmission, thereby making it possible to achieve high-quality transmission even when a temporal variation occurs in the voltage controlled oscillator.

Also, preferably, the PLL circuit is a digital PLL circuit. The monitoring section monitors whether or not the low-frequency signal has been input, and produces the correction table during any period in which the low-frequency signal is input. In the correction table, a digital value of the control voltage information during the period is information about a control voltage after correction, and a digital value of the low-frequency signal is information about a control voltage before correction.

Also, preferably, the correction table is produced during any period in which the PLL circuit is in a locked state, and may be updated during a period in which transmission is being performed. Thereby, a correction table is produced before transmission, and the correction table is modified as required during transmission thereby making it possible to achieve high-quality transmission even when a temporal variation occurs in the voltage controlled oscillator.

Also, preferably, the PLL circuit is a digital PLL circuit. The modulation apparatus further comprises a test signal generating section operable to output a digital test signal as the low-frequency signal, during a predetermined period, when the PLL circuit is in the locked state. The monitoring section monitors a digital value of the control voltage information during any period in which the test signal is being output. The correction table storing section stores the correction table in which the digital value monitored by the monitoring section is information about a control voltage after correction and a digital value obtained by adding a digital value of a channel signal to a digital value of the test signal is information about a control voltage before correction. The monitoring section further monitors whether or not the low-frequency signal has been input, and during any period in which the low-frequency signal is input, updates the correction table, wherein, in the updated correction table, a digital value of the control voltage information during the period is information about a control voltage after correction, and a digital value of the low-frequency signal is information about a control voltage before correction.

Also, preferably, the modulation apparatus further comprises a test signal generating section operable to output a test signal as the low-frequency signal during a predetermined period, when the PLL circuit is in a locked state, and a loop band changing section operable to change the loop band. The test signal generating section changes a frequency of the test signal, depending on a loop band. Thereby, the loop band of the PLL circuit can be changed, depending on a loop band required by the whole system, so that the frequency of the test signal is changed, depending on the loop band. Therefore, when the loop band can be broadened, the frequency of the test signal is increased, thereby making it possible to more quickly produce the correction table.

Further, preferably, the PLL circuit is a digital PLL circuit. The monitoring section, the correction table storing section, and the correction section are comprised of an RAM for storing control voltage information during a period in which the low-frequency signal is being input, the control voltage information including a digital value obtained by adding a digital value of a channel signal to a digital value of the low-frequency signal as read and write addresses.

Also, the modulation apparatus of the present invention can be used as a modulation section in a transmission apparatus for polar-modulating and transmitting digital transmission data, comprising an I/Q conversion section operable to convert transmission data into an in-phase component and a quadrature component, a polar conversion section operable to convert the in-phase component and the quadrature component obtained by the I/Q conversion section into an amplitude component and a phase component, an AM modulation section operable to convert the amplitude component into an analog signal, a modulation section operable to phase-modulate a channel signal to be used as a reference, based on the phase component, and a power amplifier operable to modulate a signal output from the modulation section using a signal output from the AM modulation section to output a transmission signal. Also, this transmission apparatus can be incorporated into a communication terminal.

Also, the modulation apparatus of the present invention can be incorporated, as a correction apparatus for correcting the non-linearity of a voltage controlled oscillator used in a PLL circuit, or a PLL circuit for changing a phase of an output signal output from the voltage controlled oscillator by changing a transmission signal before and after a built-in low-pass filter, into a system.

According to the present invention, control voltage information is monitored in a situation in which a low-frequency signal is being input. Therefore, the control voltage information is monitored in a situation in which tracking of a PLL circuit is achieved. Therefore, the monitored control voltage information is about a control voltage when the voltage controlled oscillator is operated in a linear manner. As a result, information about a control voltage after correction which allows a linear operation can be obtained based on the monitored control voltage information. Only by preparing information about a control voltage after correction and information about a control voltage before correction as a correction table and correcting a control voltage, the voltage controlled oscillator can output an output signal without a distortion. Therefore, the non-linearity of the voltage controlled oscillator can be simply and quickly corrected without using a conventional advanced digital signal processing technique.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing a functional configuration of a communication terminal 1 according to a first embodiment of the present invention.

FIG. 7 is a diagram showing an exemplary format of a correction table stored in a correction table storing section 206.

DESCRIPTION OF THE PREFERRED EMBODIMENTS

First Embodiment

Figure 2:
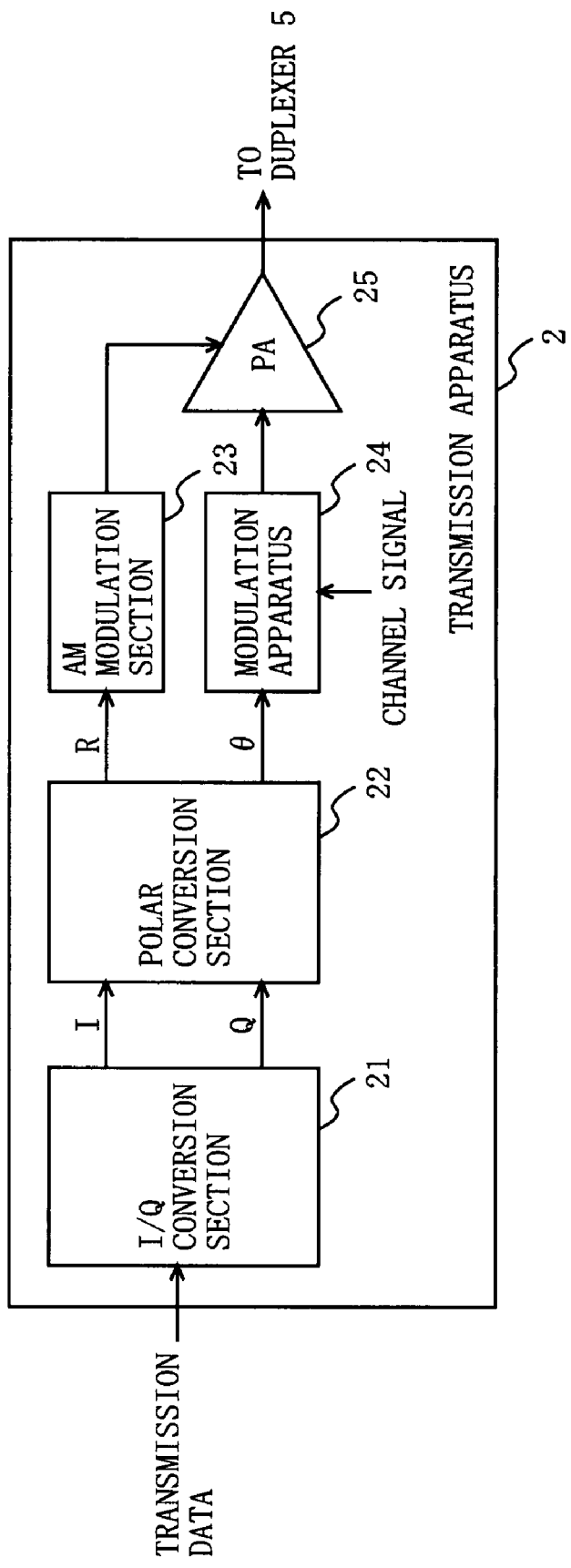
FIG. 2 is a diagram showing a detailed exemplary configuration of a transmission apparatus 2 of FIG. 1.

FIG. 1 is a diagram showing a functional configuration of a communication terminal 1 according to a first embodiment of the present invention. In FIG. 1, the communication terminal 1 comprises a transmission apparatus 2, a reception apparatus 3, a baseband processing section 4, a duplexer 5, and an antenna 6.

The baseband processing section 4 inputs transmission data containing information to be transmitted, to the transmission apparatus 2. The transmission apparatus 2 performs modulation based on the transmission data and inputs the resultant transmission signal to the duplexer 5. The duplexer 5 propagates the transmission signal to the antenna 6. Thereby, the transmission signal is output from the antenna 6. On the other hand, a reception signal received by the antenna 6 is input via the duplexer 5 to the reception apparatus 3. The reception apparatus 3 demodulates the reception signal and inputs the result to the baseband processing section 4. The baseband processing section 4 processes the demodulated reception signal and processes audio, video, data or the like as required.

FIG. 2 is a diagram showing a detailed exemplary configuration of the transmission apparatus 2 of FIG. 1. In FIG. 2, the transmission apparatus 2 includes an I/Q conversion section 21, a polar conversion section 22, an AM modulation apparatus 23, a modulation apparatus 24, and a power amplifier (PA) 25.

The I/Q conversion section 21 converts the transmission data into an in-phase component and a quadrature component and outputs these components as a digital I signal and Q signal. The polar conversion section 22 converts the I and Q signal output by the I/Q conversion section 21 into an amplitude component and a phase component in a polar coordinate system and outputs these components as a digital amplitude signal R and phase signal θ. The AM modulation apparatus 23 converts the amplitude signal R into an analog value and outputs the analog value to the PA 25. The modulation apparatus 24 comprises a PLL circuit including a voltage controlled oscillator. The modulation apparatus 24 includes a voltage controlled oscillator capable of outputting a signal having a constant frequency based on a channel signal having a constant digital value. The modulation apparatus 24 changes a phase of the output signal of the voltage controlled oscillator based on the phase signal θ and inputs the phase-modulated signal to the PA 25. The PA 25 modulates an amplitude of the signal output from the modulation apparatus 24 based on the signal output from the AM modulation apparatus 23 and propagates the resultant transmission signal to the duplexer 5. Thereby, the transmission data is polar-modulated and the resultant transmission signal is transmitted from the antenna 6.

Figure 3:
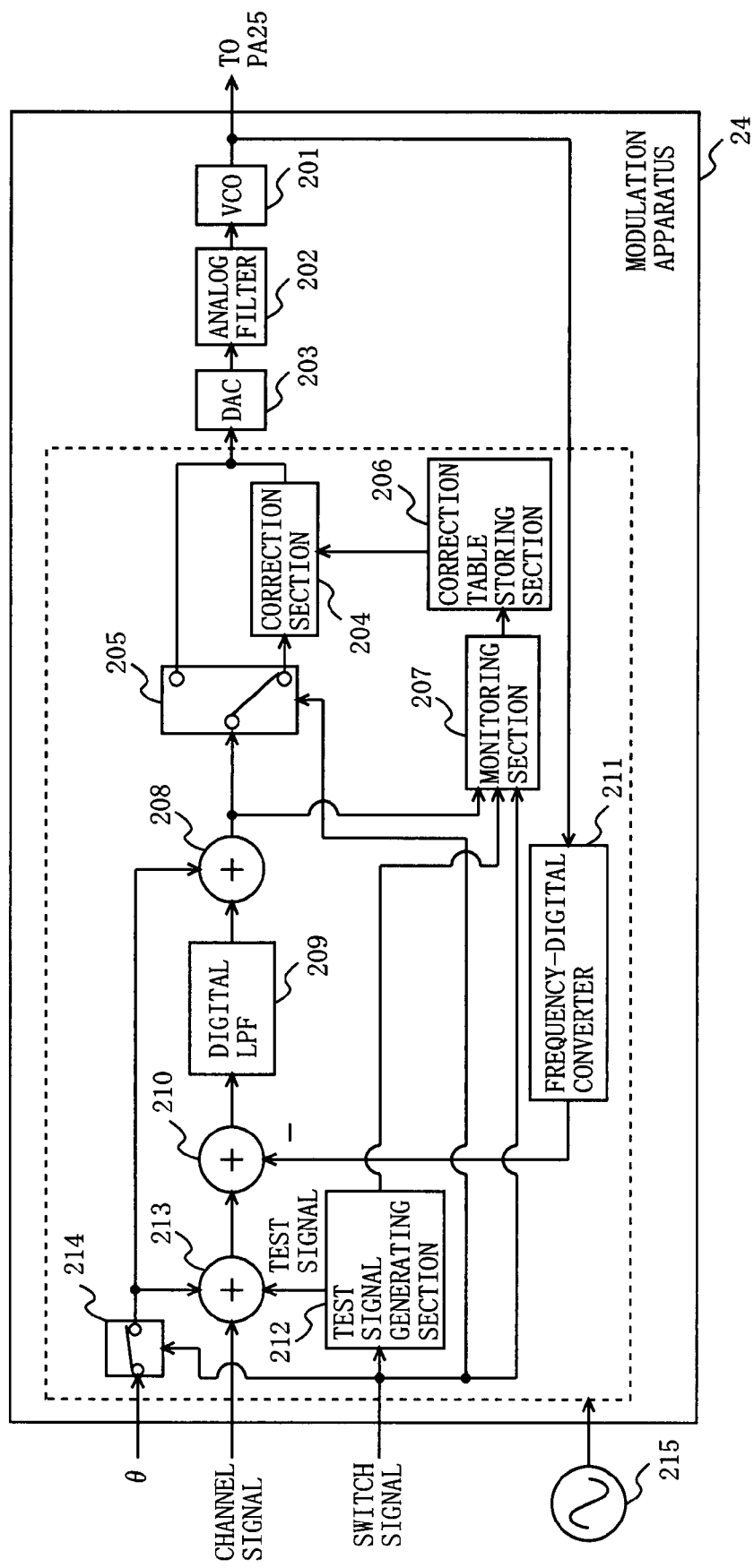
FIG. 3 is a diagram showing a detailed exemplary configuration of a modulation apparatus 24 according to the first embodiment of the present invention.

FIG. 3 is a diagram showing a detailed exemplary configuration of the modulation apparatus 24 of FIG. 2, i.e., a configuration of the modulation apparatus 24 of the first embodiment of the present invention. In FIG. 3, the modulation apparatus 24 includes a voltage controlled oscillator (VCO) 201, an analog filter 202, a digital-analog converter (DAC) 203, a correction section 204, a switch section 205, a correction table storing section 206, a monitoring section 207, an addition section 208, a digital low-pass filter (digital LPF) 209, a subtraction section 210, a frequency-digital converter (FDC) 211, a test signal generating section 212, an addition section 213, and a switch section 214. The correction section 204, the switch section 205, the correction table storing section 206, the monitoring section 207, the addition section 208, the digital LPF 209, the subtraction section 210, the FDC 211, the test signal generating section 212, the addition section 213, and the switch section 214 are digital circuits and are operated in accordance with a reference clock output from a reference clock generating section 215. A digital PLL circuit is comprised of a feedback loop from the addition section 213 to the VCO 201 and the FDC 211.

Firstly, an operation when the digital PLL circuit is locked into a desired frequency will be described. When transmission is started, a transmission frequency is determined within a system. The transmission apparatus 2 inputs a channel signal having a constant digital value to the modulation apparatus 24, depending on the transmission frequency. The channel signal is input via the addition section 213 and the subtraction section 210 to the digital LPF 209. The digital LPF 209 outputs a digital signal in which a high frequency component of the channel signal is suppressed. The digital signal output from the digital LPF 209 is information about a control voltage applied to the VCO 201 (hereinafter referred to as control voltage information).

Until the digital PLL circuit is locked, the switch section 205 connects the addition section 208 and the DAC 203. The control voltage information is input via the adder 208 to the DAC 203. The DAC 203 converts the input control voltage information into an analog signal. A high frequency component is removed from the analog signal by the analog filter 202, and the resultant signal is input as a control voltage to the VCO 201. The VCO 201 outputs a signal having a frequency corresponding to the input control voltage.

The signal output from the VCO 201 is input to the FDC 211. The FDC 211 converts the frequency of the output signal into a digital signal and inputs the digital signal to the subtraction section 210. When the output signal from the VCO 201 does not have a desired frequency, a difference occurs between the digital value indicated by the channel signal and a digital value indicated by the FDC 211. A digital signal corresponding to this difference is output from the subtraction section 210 and is input to the digital LPF 209. Thereby, a change occurs in the control voltage information, resulting in a change in the frequency of the output signal from the VCO 201. The changed output signal is input to the FDC 211. The subtraction section 210 inputs, to the digital LPF 209, a digital signal corresponding to a difference between the channel signal and the digital signal of the frequency of the output signal. By such a feedback loop, the digital signal output from the subtraction section 210 eventually becomes a value equivalent to zero, so that the control voltage is fixed, and the VCO 201 outputs a signal having a frequency corresponding to the channel signal, whereby the digital PLL circuit is locked.

Figure 4:
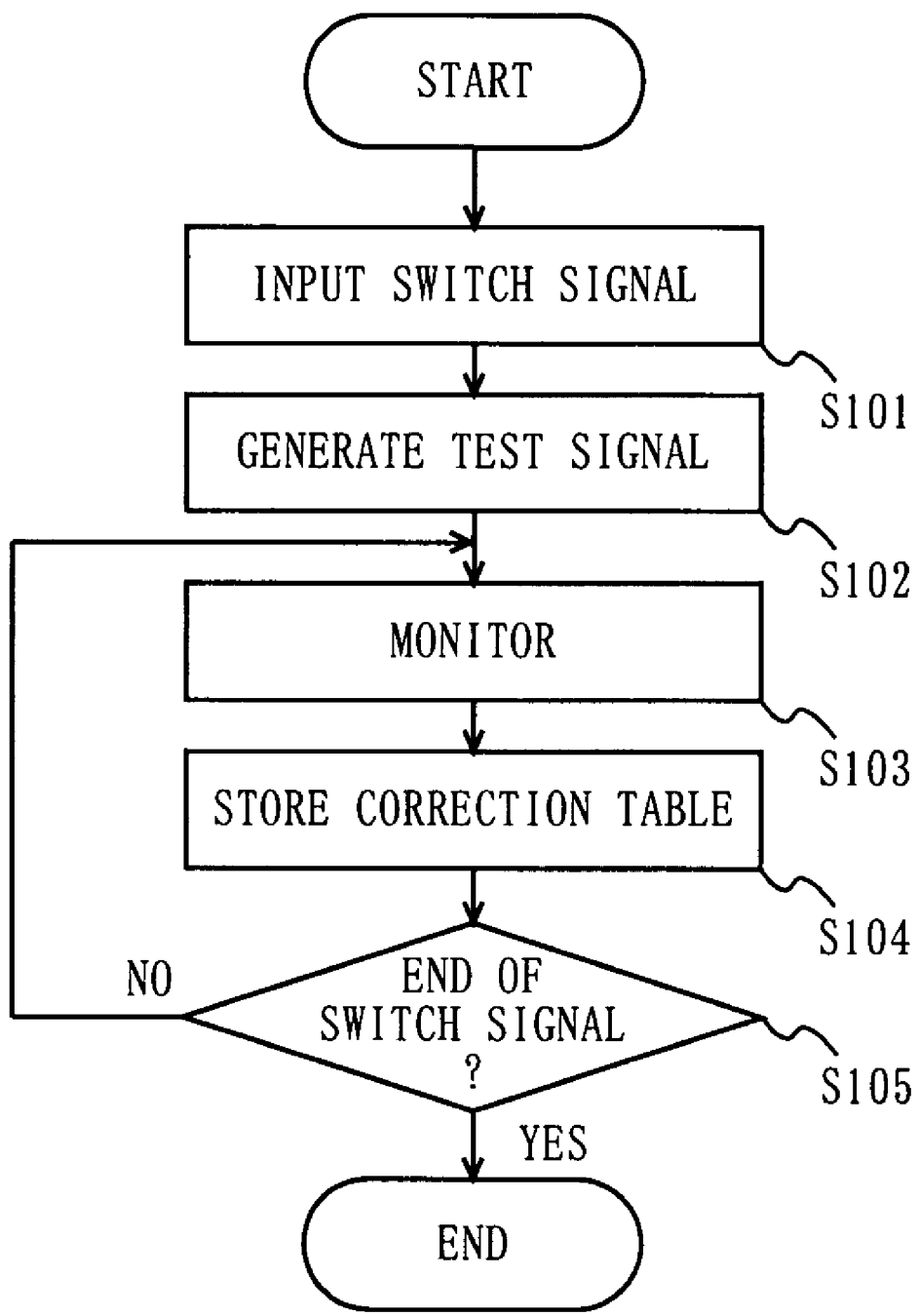
FIG. 4 is a flowchart showing an operation of the modulation apparatus 24 when a correction table is produced.

After the digital PLL circuit is locked, a correction table is produced. FIG. 4 is a flowchart showing an operation of the modulation apparatus 24 when the correction table is produced. Hereinafter, an operation of the modulation apparatus 24 when the correction table is produced will be described with reference to FIGS. 3 and 4.

After the digital PLL circuit is locked, the transmission apparatus 2 inputs a switch signal to the modulation apparatus 24 with predetermined timing (step S101). The switch signal is input to the switch sections 214 and 205, the test signal generating section 212, and the monitoring section 207. The switch section 214, when receiving the switch signal, goes to the OFF state. The switch section 205, when receiving the switch signal, switches to connect the addition section 208 and the DAC 203. The test signal generating section 212, when receiving the switch signal, generates and inputs a test signal to the addition section 213 and the monitoring section 207 (step S102).

The test signal is a low-frequency signal having a frequency within a loop band of the digital PLL circuit. In general, in either a digital or analog PLL circuit, the closed-loop transfer function of the PLL circuit is equivalent to the transfer function of an LPF. Hereinafter, when a PLL circuit is simply mentioned, the PLL circuit includes both digital and analog PLL circuits. Therefore, this low-pass function has a band in which the gain of an output with respect to an input is 0 dB. This band is called a loop band. In other words, the loop band refers to a frequency band in which a loop gain is 0 dB, i.e., a frequency band in which an open loop gain is "1". When a low-frequency signal having a frequency within the loop band is input, a feedback loop can follow (track) variations in an input frequency. In other words, a frequency band for which tracking is possible is a loop band. For example, if a loop band is 100 KHz, the frequency of a test signal is assumed to be 100 KHz or less.

The test signal is added to the channel signal by the addition section 213, and the result is input via the subtraction section 210 to the digital LPF 209. The monitoring section 207, when receiving the switch signal, starts monitoring the control voltage information which is the output of the digital LPF 209 (step S103). The monitoring section 207 associates the detected control voltage information with a digital value obtained by adding the digital value of the channel signal to a digital value of the test signal to produce a correction table, and stores the correction table into the correction table storing section 206 (step S104). Note that an input channel for the channel signal to the monitoring section 207 is not shown for the sake of simplicity. The modulation apparatus 24 determines whether or not the switch signal is ended (step S105), and continues to produce the correction table until the switch signal is ended.

Figure 5:
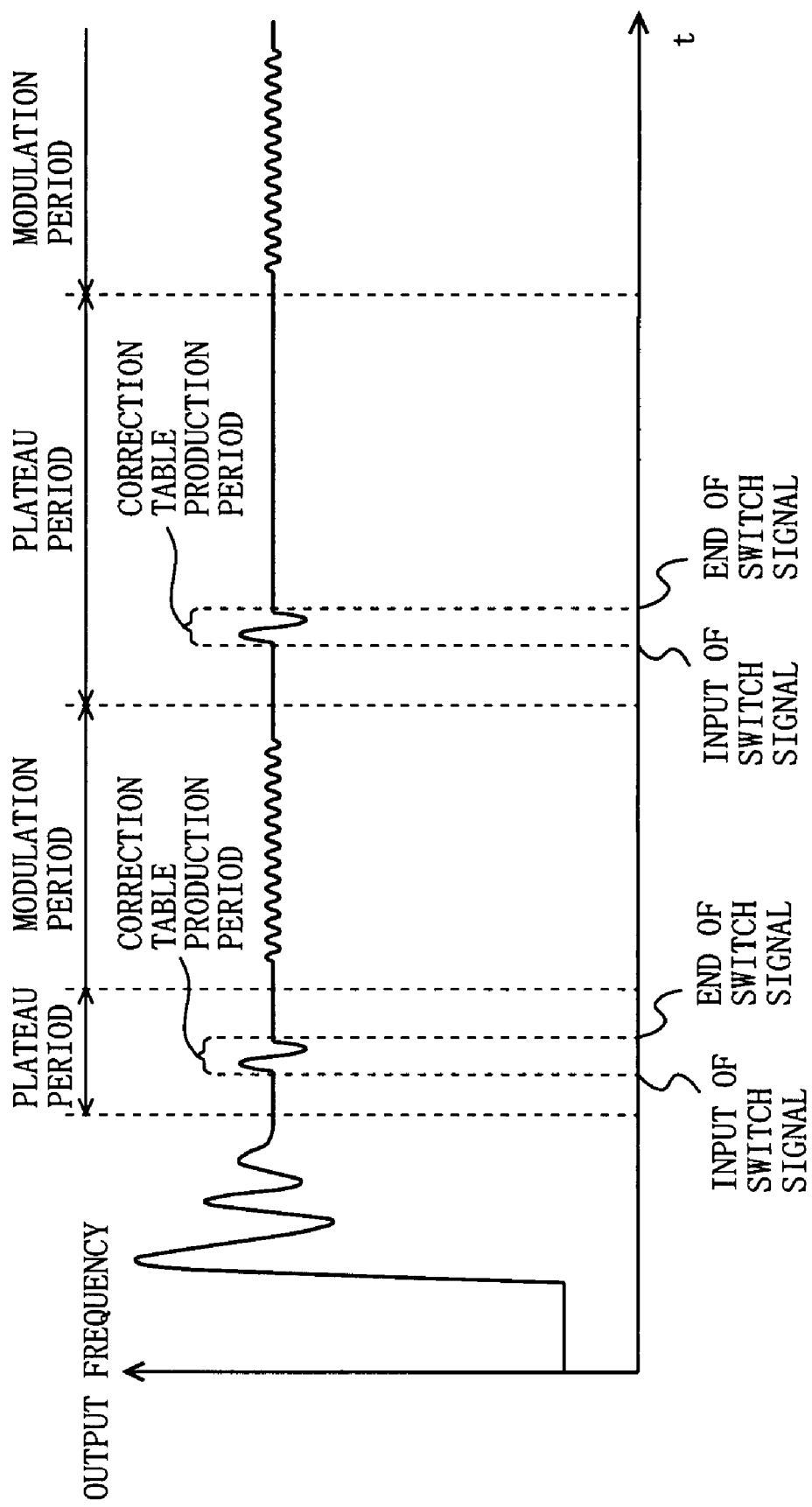
FIG. 5 is a diagram for describing a period in which a correction table is produced by the modulation apparatus 24.

FIG. 5 is a diagram for describing a period in which the correction table is produced by the modulation apparatus 24. In FIG. 5, the horizontal axis represents time and the vertical axis represents output frequencies of the VCO 201. After the digital PLL circuit is locked and a plateau period is started, a switch signal is input with predetermined timing. When the switch signal is input, a test signal is generated and the output frequency of the VCO 201 is changed. In this case, since the frequency of the test signal is within a loop band, the digital PLL circuit can track variations in the input frequency. When the switch signal is ended, the test signal is interrupted, so that the variation of the input frequency is stopped. Thereafter, a modulation period arrives and phase modulation is performed. Hereinafter, a period from the input to the end of a switch signal is referred to as a correction table production period.

Figure 6A:
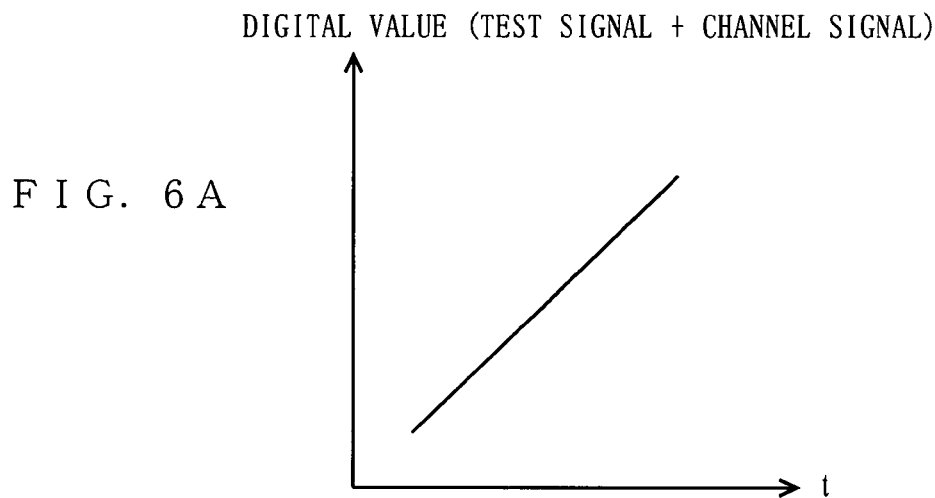
FIG. 6A is a diagram showing a test signal.
Figure 6B:
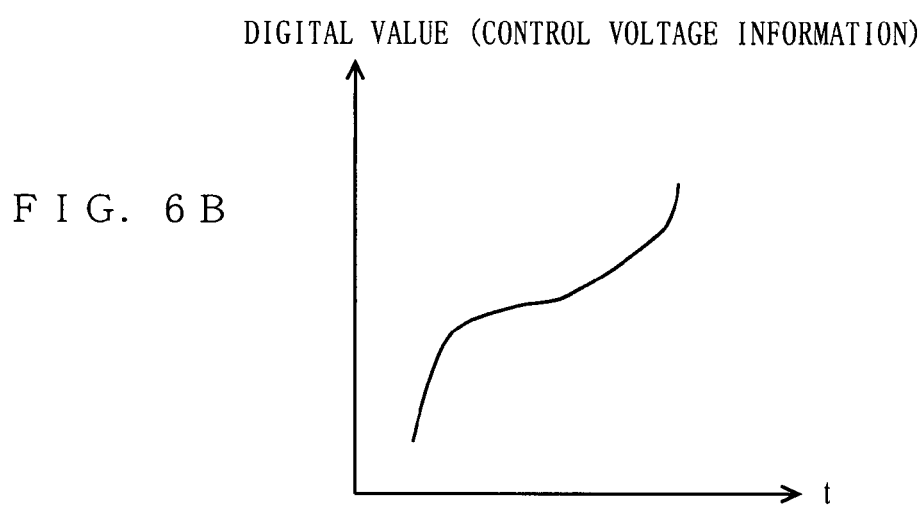
FIG. 6B is a diagram showing control voltage information.
Figure 6C:
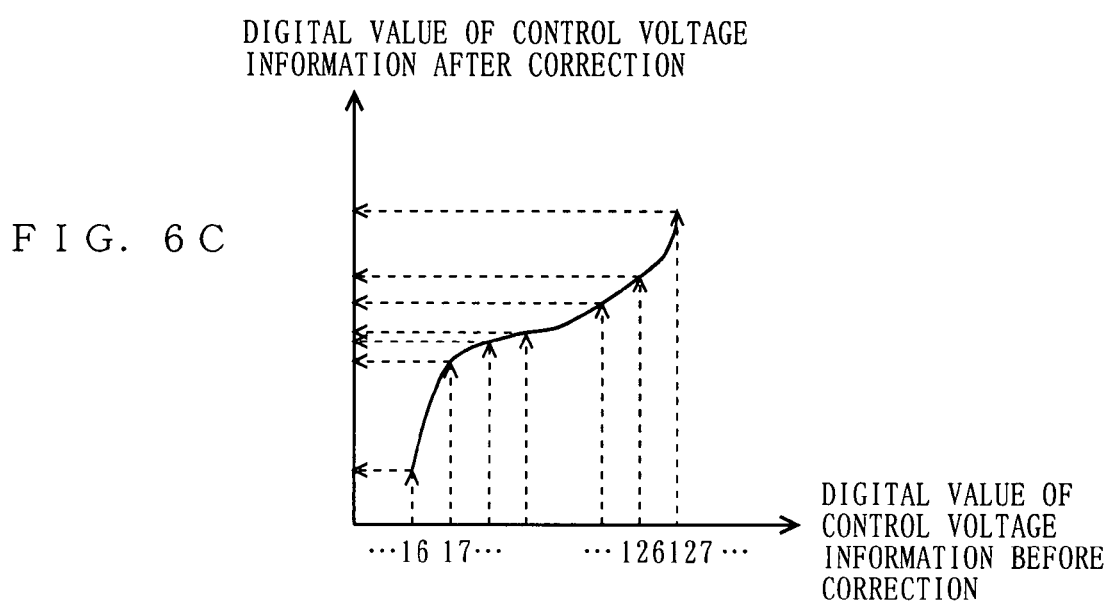
FIG. 6C is a diagram showing a relationship of digital values before and after correction.

FIGS. 6A to 6C are diagrams showing relationships between the test signal, the control voltage information, and the correction table. Hereinafter, the reason why the non-linearity of the VCO 201 can be corrected by the correction table will be described with reference to FIGS. 6A to 6C.

For example, as shown in FIG. 6A, it is assumed that a test signal which varies in a linear manner is used. Note that FIG. 6A shows variations in the digital value obtained by adding the digital value of the channel signal to the digital value of the test signal. The frequency of the test signal, i.e., a frequency at which the test signal varies, falls within a loop band, which is a tracking state, and therefore, the VCO 201 outputs an output signal without a distortion. In a state in which the output signal is output without a distortion, the control voltage itself varies in a non-linear manner due to the non-linearity of the VCO 201. Therefore, as shown in FIG. 6B, the control voltage information also varies in a non-linear manner as is similar to the non-linear variations in the control voltage. Therefore, if it is desired to obtain a linear output signal with respect to the input of FIG. 6A, the control voltage may be varied in a non-linear manner based on the non-linear control voltage information of FIG. 6B.

Therefore, as shown in FIG. 6C, for a digital value of the input control voltage information before correction (the vertical axis of FIG. 6A), a digital value of the control voltage information obtained as a result of monitoring (the vertical axis of FIG. 6B) is used as a digital value of the control voltage information after correction, thereby making it possible to cause the output signal of the VCO 201 to be linear, so that the correction of the control voltage is achieved. Note that, in FIG. 6C, as an example, the control voltage information is divided into digital values of 16 to 127.

As shown in FIG. 6C, the monitoring section 207 associates a digital value obtained by adding the digital value of the channel signal to a digital value of the test signal (a digital value of the control voltage information before correction) with the control voltage information obtained by monitoring (a digital value of the control voltage information after correction) to produce a correction table. FIG. 7 is a diagram showing an exemplary format of the correction table stored in the correction table storing section 206.

Figure 8A:
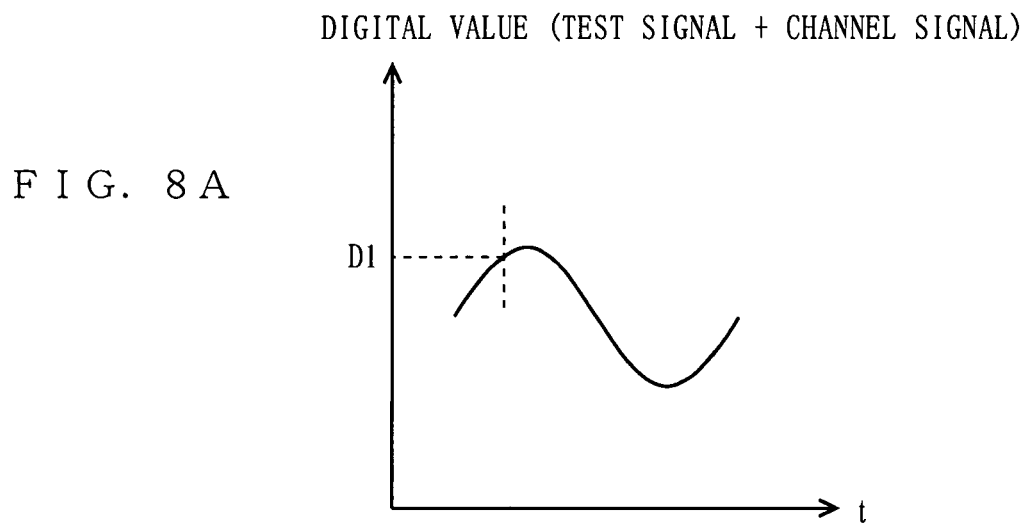
FIG. 8A is a diagram showing a test signal.
Figure 8B:
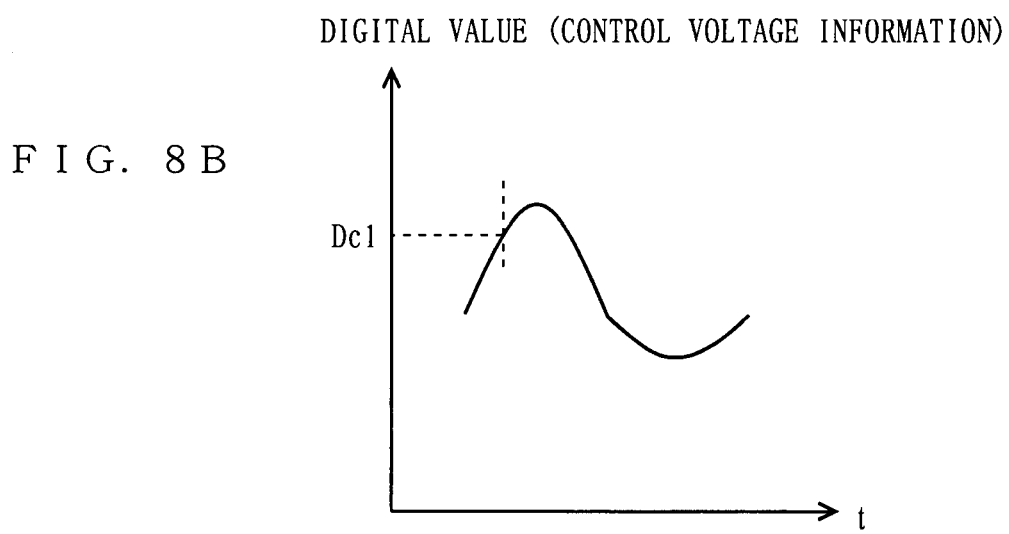
FIG. 8B is a diagram showing control voltage information.
Figure 8C:
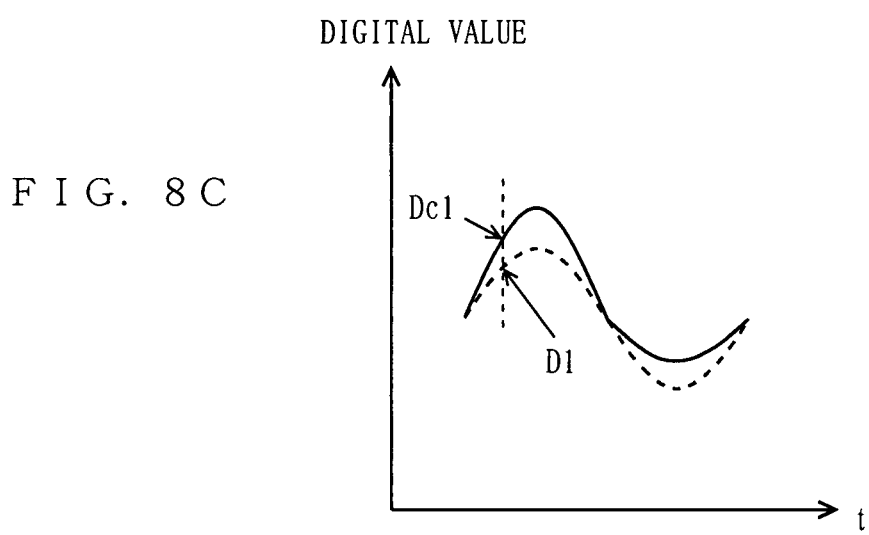
FIG. 8C is a diagram showing a relationship of digital values before and after correction.

If the frequency of the test signal falls within the loop band, the test signal is not limited to a signal which varies in a linear manner as shown in FIG. 6A. FIGS. 8A to 8C are diagrams showing relationships between a test signal, control voltage information, and a correction table, where the test signal is another one. Note that FIG. 8A shows variations in a digital value obtained by adding the digital value of the channel signal to a digital value of the test signal.

As shown in FIG. 8A, a case where a test signal which has sine-curve variations is used will be considered. In this case, the frequency of the test signal falls within a loop band, which is a tracking state, and therefore, the VCO 201 outputs an output signal without a distortion. Also, the control voltage itself varies in a non-linear manner due to the non-linearity of the VCO 201. Therefore, as shown in FIG. 8B, the control voltage information also varies in a non-linear manner as is similar to the non-linear variations in the control voltage. Therefore, if it is desired to obtain a linear output signal with respect to the input of FIG. 8A, the control voltage may be varied in a non-linear manner based on the non-linear control voltage information of FIG. 8B.

Therefore, as shown in FIG. 8C, for a digital value of the input control voltage information before correction (the vertical axis of FIG. 8A, e.g., Dl1), a digital value of the control voltage information obtained by monitoring (the vertical axis of FIG. 8B, e.g., Dc1) is used as a digital value of the control voltage information after correction, thereby making it possible to cause the output signal of the VCO 201 to be linear, so that the correction of the control voltage can be achieved. Therefore, the test signal may have any waveform as long as it has a frequency within a loop band.

Note that the digital value of the test signal preferably varies so that the VCO 201 can output a signal having a frequency band used for modulation. Specifically, the digital value of the test signal may oscillate so that the VCO 201 can output from an upper limit to a lower limit of a frequency band used for modulation. For example, when the upper limit of the frequency band used for modulation is a frequency f1 and the lower limit is a frequency f2, then if a digital value at a crest of the sine curve is used, the VCO 201 can output an output signal having the frequency f1 or more, or if a digital value at a trough of the sine curve is used, the VCO 201 can output an output signal having the frequency f2 or less, in the example of FIG. 8A.

Next, the modulation apparatus 24 performs phase modulation based on the phase signal θ during the modulation period. Hereinafter, an operation of the modulation apparatus 24 when phase modulation is performed will be described.

During the modulation period, since the switch signal has already been ended, the switch section 214 is in the ON state. Also, the switch section 205 switches to connect the correction section 204 and the addition section 208. The phase signal θ is input to the addition section 213 and the addition section 208. The addition section 213 adds the channel signal and the phase signal θ together and the resultant digital signal is input via the subtraction section 210 to the digital LPF 209. The digital LPF 209 inputs a signal in which a high frequency component is suppressed to the addition section 208. The addition section 208 adds the input digital signal and the phase signal θ together and outputs the result. The digital signal output from the addition section 208 is a voltage control signal before correction. The digital phase signal θ is added to the channel signal before and after the digital LPF 209, so that a signal propagating through the digital PLL circuit is changed. Therefore, the modulation apparatus 24 functions as a modulation apparatus employing the two-point modulation method.

The correction section 204 recognizes the digital value of the voltage control signal after correction corresponding to the digital value of the voltage control signal before correction with reference to the correction table stored in the correction table storing section 206, and inputs a digital signal having the digital value after correction to the digital-analog conversion section 203. The digital-analog conversion section 203 converts the input digital signal into an analog signal. The analog filter 202 suppresses a high frequency component of the analog signal and inputs the result as a control voltage to the VCO 201. The correction section 204, the digital-analog conversion section 203, and the analog filter 202 can be considered, in a broad sense, as a correction section which corrects the control voltage based on the correction table so that the output of the VCO 201 is caused to be linear. The VCO 201 outputs a signal which has been phase-modulated using the phase signal θ.

As described above, according to the modulation apparatus 24 of the first embodiment of the present invention, a correction table for causing the VCO 201 to operate in a linear manner is produced by monitoring control voltage information while causing the digital PLL circuit to perform tracking, and a control voltage is corrected based on the correction table. Thereby, the non-linearity of the VCO 201 can be simply and quickly corrected without using an advanced digital signal processing technique of obtaining the inverse characteristics of the VCO. Also, since a plateau period repeatedly appears, correction is achieved, depending on the characteristics of the VCO 201 varying over time.

Although it has been assumed in the first embodiment that the test signal is input to the addition section 213 before the digital LPF 209, the test signal may also be input to the addition section 208 after the digital LPF 209. The closed loop from the input to the output of the PLL circuit has an LPF transfer function, and the frequency response from the input of the addition section 208 to the output of the VCO 201 is a high-pass response, so that the test signal input to the addition section 208 does not affect the control voltage. Therefore, if the test signal is input at least before the digital LPF 209, a desired operation is achieved. Therefore, for example, an addition section for adding the output of the test signal generating section 212 and the phase signal θ together may be additionally provided so that an output of this addition section and the channel signal are added together by the addition section 213.

Also, although it has been assumed in the first embodiment that the monitoring section 207 adds the digital value of the channel signal to the digital value of the test signal to obtain control voltage information before correction, the present invention is not limited to this. For example, the monitoring section 207 may monitor the output of the addition section 213 when the test signal is being generated, and the monitored digital value may be used as the control voltage information before correction.

Also, the switching arrangement of the switch sections 205 and 214 is not limited to that which has been described in the first embodiment.

Also, although it has been assumed that the monitoring section 207 monitors the control voltage information during the whole period in which the test signal is input, a period in which the control voltage information is monitored may be any part of the period in which the test signal is input. In other words, even when the monitoring section 207 monitors the control voltage information during only a portion of the whole period, the correction table can be completed. For example, in the example of FIG. 8A, monitoring may be performed only during a period from a crest to a trough of the test signal.

Figure 9:
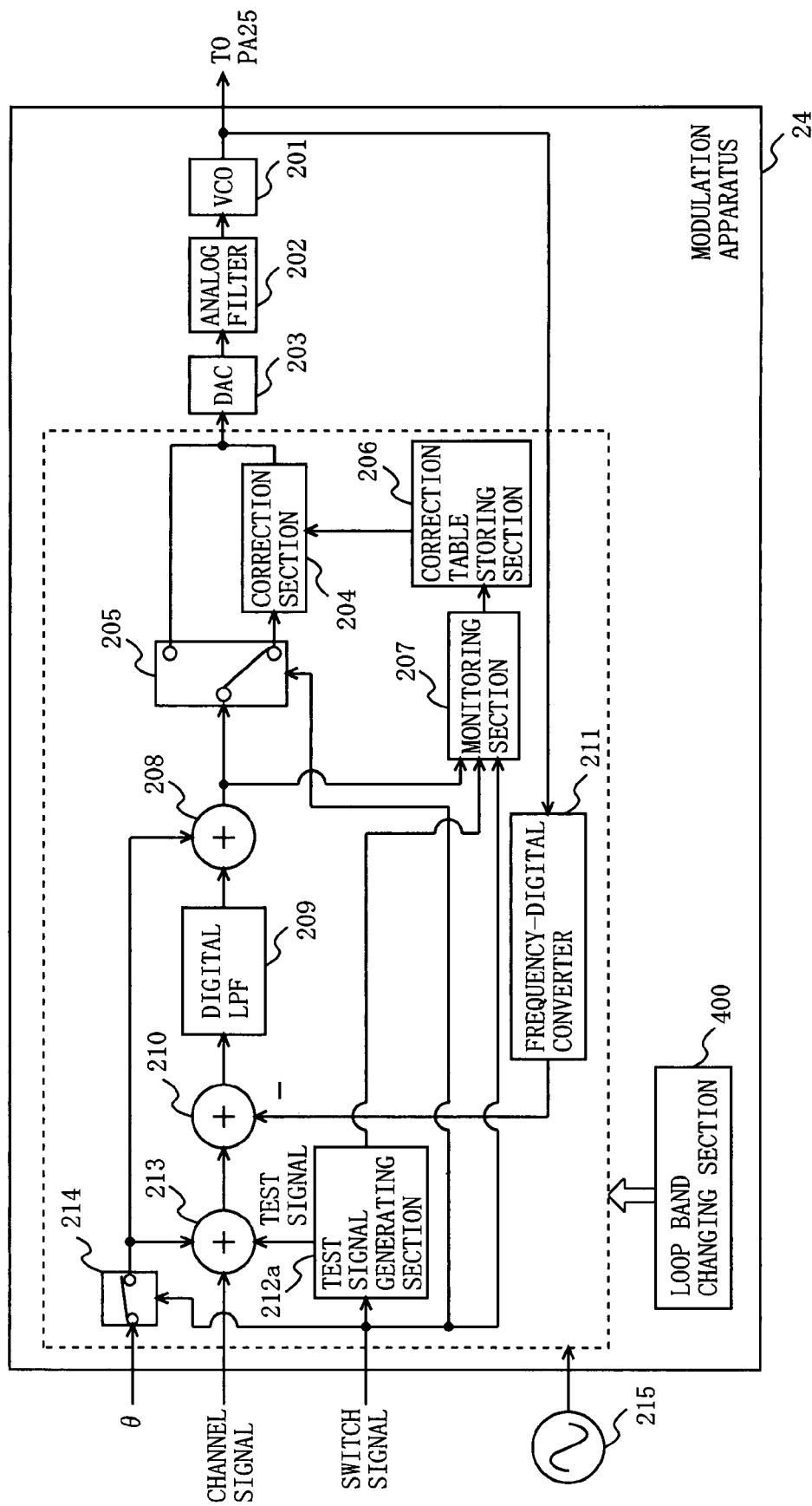
FIG. 9 is a diagram showing another configuration of the modulation apparatus 24 of the first embodiment of the present invention.

Further, the loop band of the PLL circuit can be changed as required. For example, in the case of a digital PLL circuit, the number of taps of the digital LPF 209 or the like may be changed, thereby making it possible to change the loop band. In the case of an analog PLL circuit, the capacitance value of the charge pump or the like may be changed, thereby making it possible to change the loop band. In the first embodiment, a time required to produce a correction table depends on the frequency of the test signal. The higher the frequency of the test signal, the shorter the time required to produce a correction table. Therefore, only by enlarging the loop band of the PLL circuit and increasing the frequency of the test signal as high as possible within the loop band, the time required to produce a correction table can be reduced. Therefore, as shown in FIG. 9, the modulation apparatus 24 may comprise a loop band changing section 400 which can change the loop band of the PLL circuit, and a test signal generating section 212a which generates a test signal having a frequency depending on a loop band changed by the loop band changing section 400. The loop band changing section 400 can be any well-known means for changing the loop band.

Second Embodiment

Figure 10:
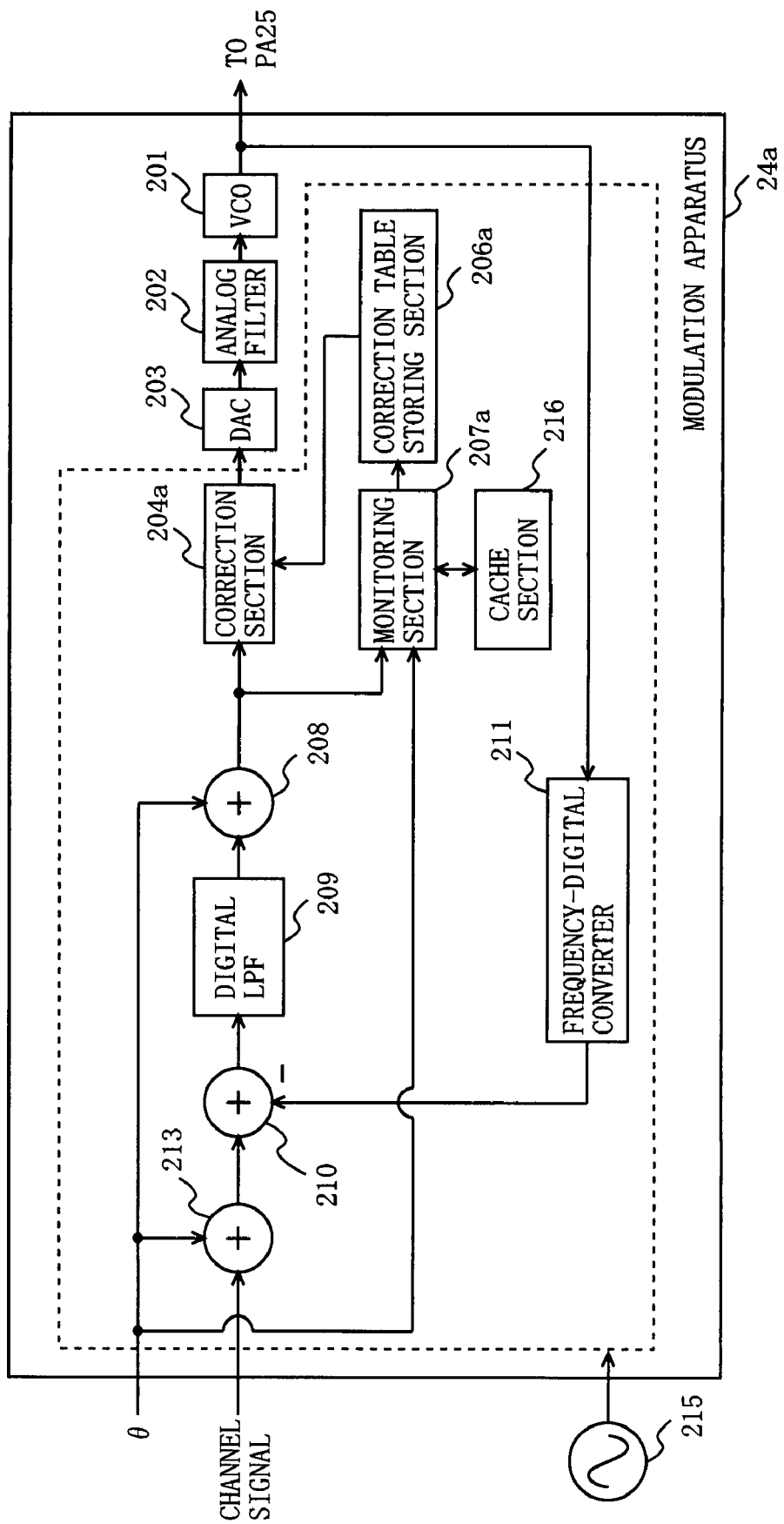
FIG. 10 is a diagram showing a configuration of a modulation apparatus 24$a$ according to a second embodiment of the present invention.

FIG. 10 is a diagram showing a configuration of a modulation apparatus 24a according to a second embodiment of the present invention. In FIG. 10, parts similar to those of the first embodiment are indicated by the same reference numerals and will not be described. The configurations of the communication terminal and the transmission apparatus are similar to those of the first embodiment, and therefore, FIGS. 1 and 2 will be referenced.

Figure 11:
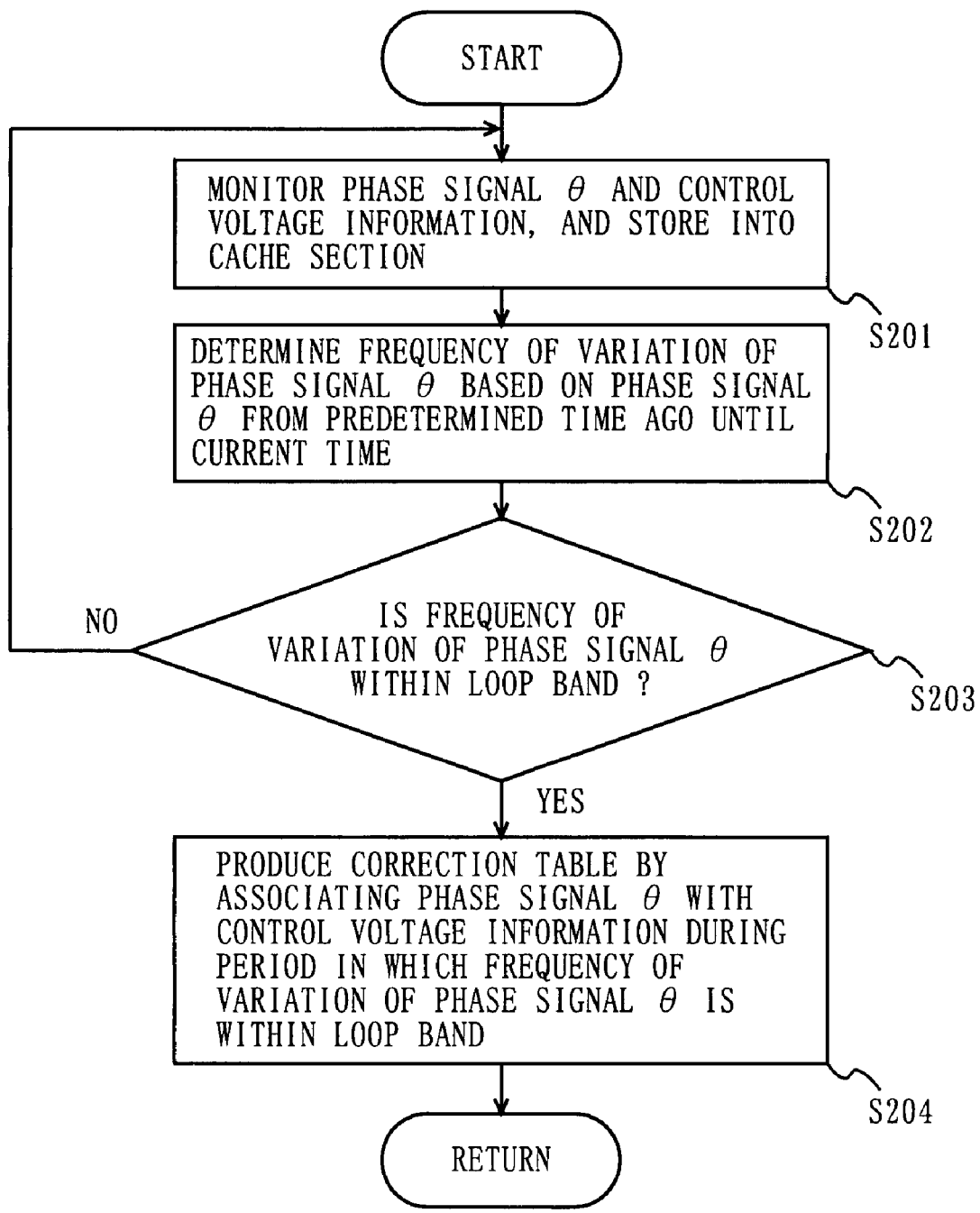
FIG. 11 is a flowchart showing an operation of the modulation apparatus 24$a$ when a correction table is produced.
Figure 12:
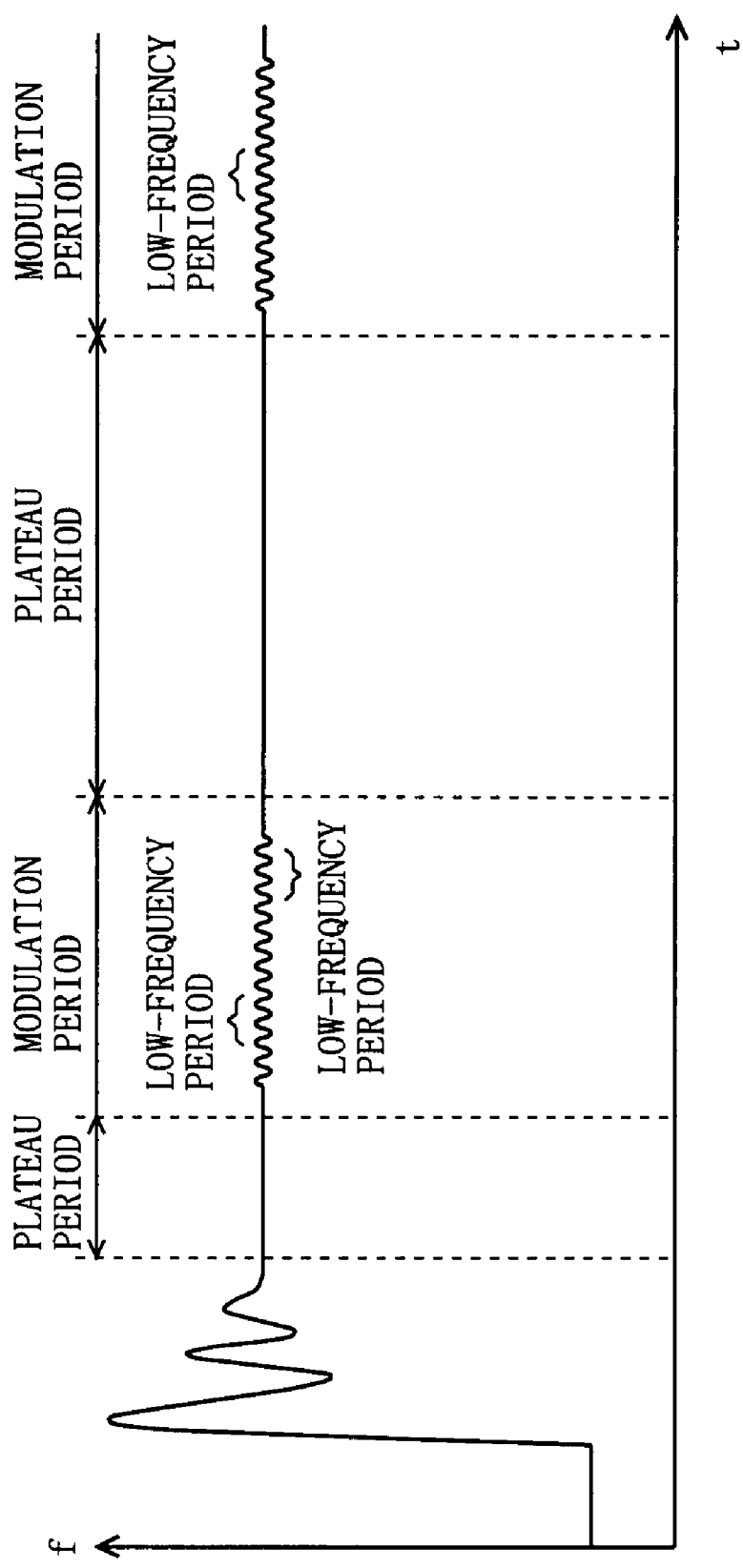
FIG. 12 is a diagram for describing a period in which a correction table is produced by the modulation apparatus 24$a$.

FIG. 11 is a flowchart showing an operation of the modulation apparatus 24a when a correction table is produced. FIG. 12 is a diagram for describing a period in which the correction table is produced by the modulation apparatus 24a. In the modulation apparatus 24a, as shown in FIG. 12, the correction table is produced during a modulation period in which transmission is being performed.

Hereinafter, an operation of the modulation apparatus 24a will be described with reference to FIGS. 10 and 11. In a manner similar to that of the first embodiment, the modulation apparatus 24a locks a digital PLL circuit. When a plateau period has passed since the locking of the digital PLL circuit, modulation of a channel signal is performed using a phase signal θ during the modulation period. The operation principle of phase modulation is also similar to that of the first embodiment. The second embodiment is different from the first embodiment in that a monitoring section 207a monitors, during the modulation period, whether or not a low-frequency signal has been input. Specifically, the monitoring section 207a monitors the phase signal θ to check whether or not the varying frequency of the phase signal θ falls within a loop band. Note that, alternatively, the monitoring section 207a can monitor the control voltage information to check whether or not the varying frequency of the phase signal θ falls within a loop band.

A more detailed description will be given with reference to FIG. 11. The monitoring section 207a monitors and stores the digital value of the phase signal θ and the digital value of the control voltage information into a cache section 216 (step S201). The monitoring section 207a determines the varying frequency of the phase signal θ based on the phase signal θ from a predetermined time ago to the current time (step S202). The monitoring section 207a determines whether or not the varying frequency of the phase signal θ falls within a loop band (step S203). Specifically, the monitoring section 207a differentiates the phase signal θ, and when the differentiated value continues to be a predetermined value or less for a predetermined time, determines that the varying frequency of the phase signal θ falls within a loop band.

When it is determined that the varying frequency of the phase signal θ does not fall within a loop band, the monitoring section 207a returns to the operation of step S201. On the other hand, when it is determined that the varying frequency of the phase signal θ falls within a loop band, the monitoring section 207a determines that a low-frequency signal has been input at least before the LPF of the digital PLL circuit, and goes to an operation of step S204. The monitoring section 207a associates a digital value of the phase signal θ which falls within the loop band with a digital value of the control voltage information to produce a correction table, and stores the produced correction table into a correction table storing section 206a (step S204). The operations of steps S201 to S204 are repeatedly performed during the modulation period.

Note that, if a low-frequency signal is not input during the modulation period, no correction table may be produced. Therefore, the correction table storing section 206a previously stores any correction table (e.g., a correction table produced before shipment). Also, a correction section 204a, when there is not a correction table corresponding to the output of the addition section 208, may output the output of the addition section 208 as it is.

During the modulation period, the correction section 204a corrects the control voltage information before correction based on the correction table, and outputs the control voltage information after correction. Based on the output control voltage information, a corrected control voltage is input to the VCO 201. Thereby, the VCO 201 is operated in a linear manner.

As described above, according to the modulation apparatus 24a of the second embodiment of the present invention, a correction table is produced during the modulation period in which transmission is being performed. Therefore, correction corresponding to the time-varying characteristics of the VCO 201 is achieved. Note that, in the second embodiment, when a low-frequency signal is input, the low-frequency signal is also input to the addition section 208. Nevertheless, a frequency response from the output of the addition section 208 to the output of the VCO 201 is a high-pass response, and therefore, the low-frequency signal does not affect the output frequency.

Note that, in the monitoring section 207, a correction table may be produced during only a part of or the whole low-frequency period in which a low-frequency signal is input. Also, when there are a plurality of low-frequency periods, a correction table may be produced during all or a portion of the low-frequency periods. In other words, a correction table may be produced during any period within a period in which a low-frequency signal is input.

Third Embodiment

Figure 13:
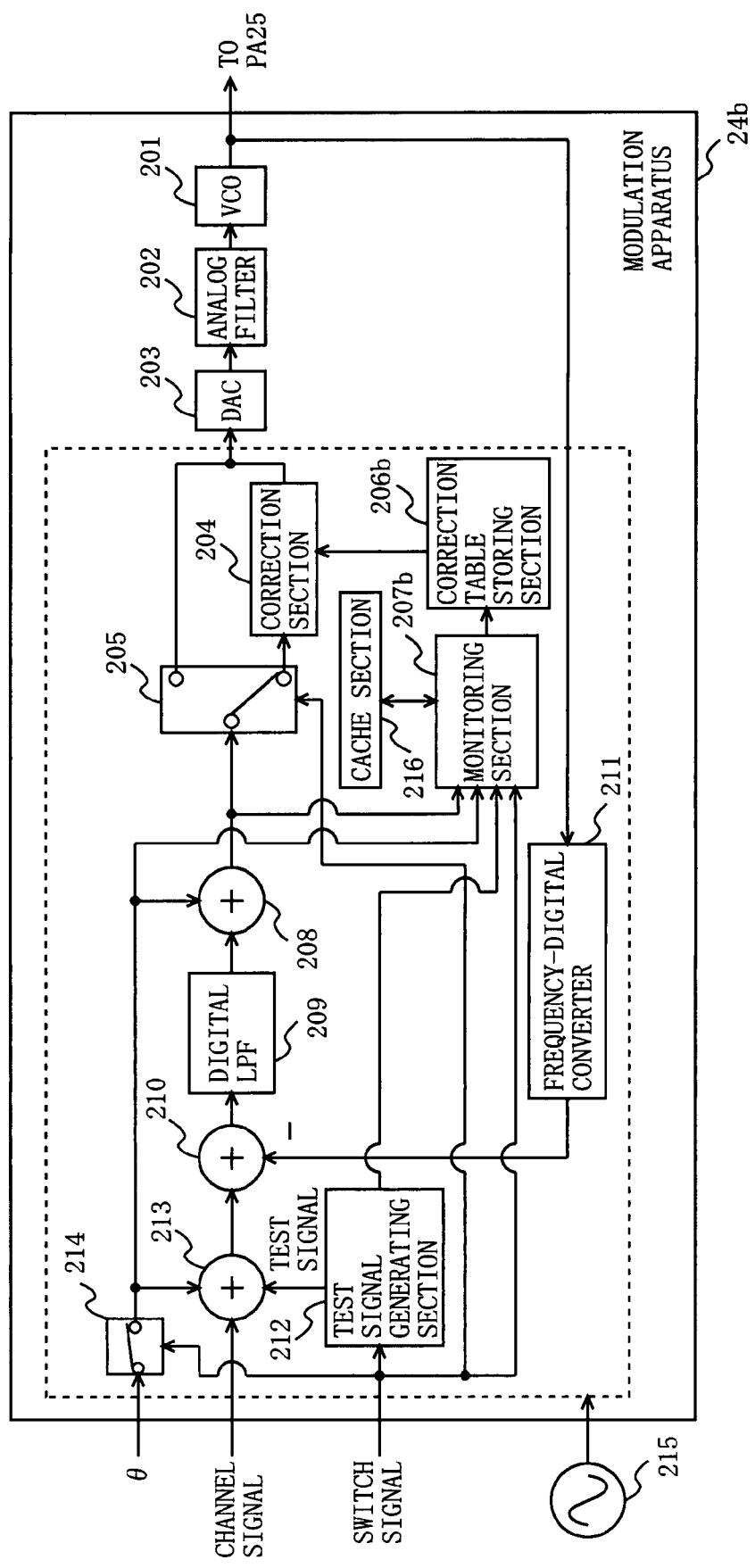
FIG. 13 is a diagram showing a configuration of a modulation apparatus 24$b$ according to a third embodiment of the present invention.

FIG. 13 is a diagram showing a configuration of a modulation apparatus 24b according to a third embodiment of the present invention. In FIG. 13, parts similar to those of the first and second embodiments are indicated by the same reference numerals and will not be described. The configurations of the communication terminal and the transmission apparatus are the same as those of the first embodiment, and therefore, FIGS. 1 and 2 will be referenced.

Figure 14:
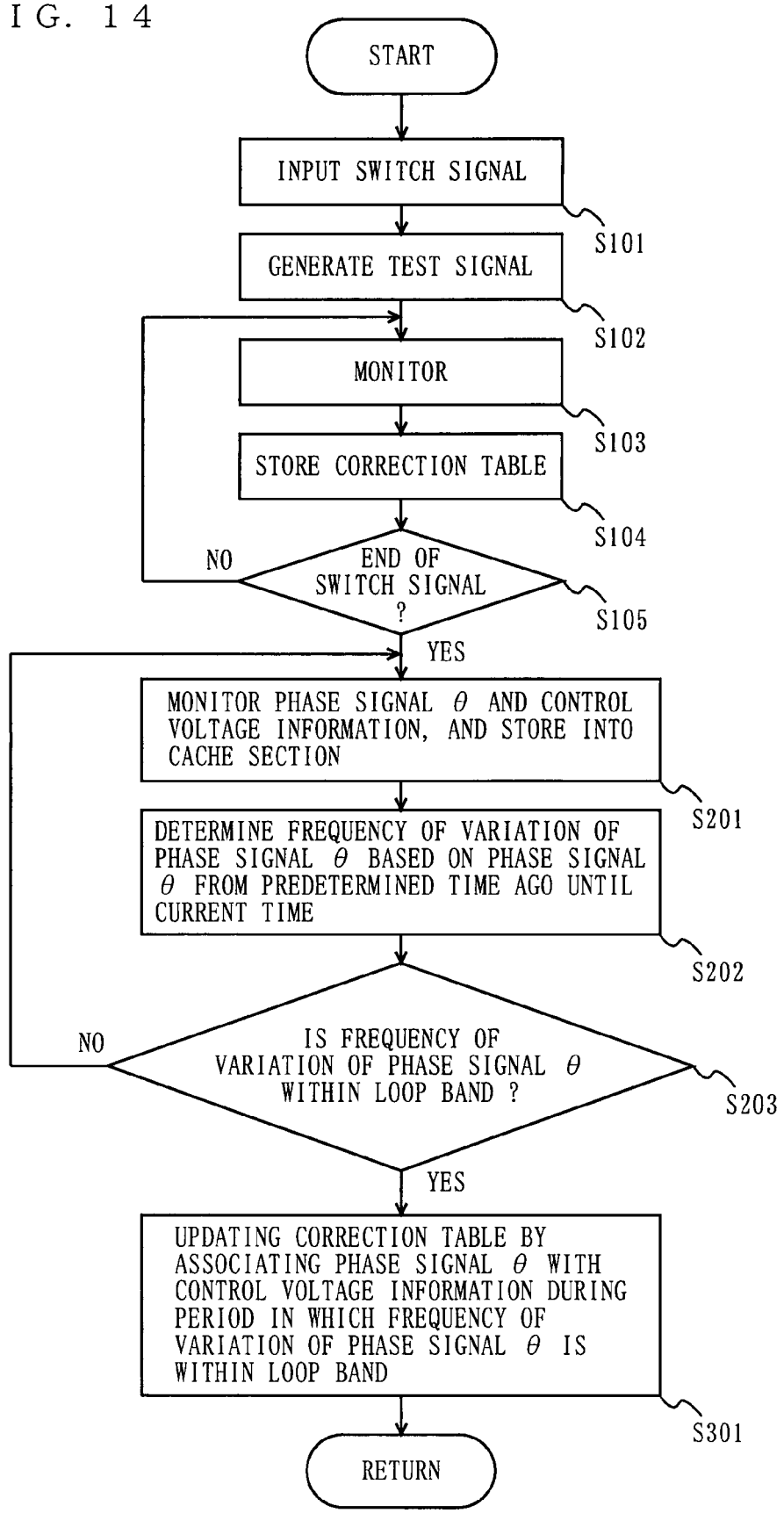
FIG. 14 is a flowchart showing an operation of the modulation apparatus 24$b$ when a correction table is produced.

FIG. 14 is a flowchart showing an operation of the modulation apparatus 24b when a correction table is produced. In FIG. 14, operations similar to those of FIGS. 4 and 11 are indicated by the same step numbers and will not be described. Hereinafter, the operation of the modulation apparatus 24b will be described with reference to FIG. 14, focusing on differences from the first and second embodiments.

A monitoring section 207b generates a test signal to produce a correction table as in the first embodiment and stores the correction table into a correction table storing section 206b during a plateau period (steps S101 to S105). Thereafter, the modulation apparatus 24b performs phase modulation while correcting a control voltage based on the produced correction table during a modulation period. During the modulation period, the monitoring section 207b monitors whether or not a low-frequency signal has been input (steps S201 to S203), and when a low-frequency signal has been input, associates a digital value of a phase signal θ falling within a loop band with a digital value of control voltage information, to update the correction table produced in steps S101 to S105 (step S301).

As described above, according to the modulation apparatus 24b of the third embodiment of the present invention, after a correction table is produced during a plateau period, if a low-frequency signal is input during a modulation period, the correction table is updated. Thereby, correction corresponding to the time-varying characteristics of the VCO 201 is achieved.

Note that, also in the third embodiment, the variations described in the first and second embodiment are similarly applied.

Fourth Embodiment

Figure 15:
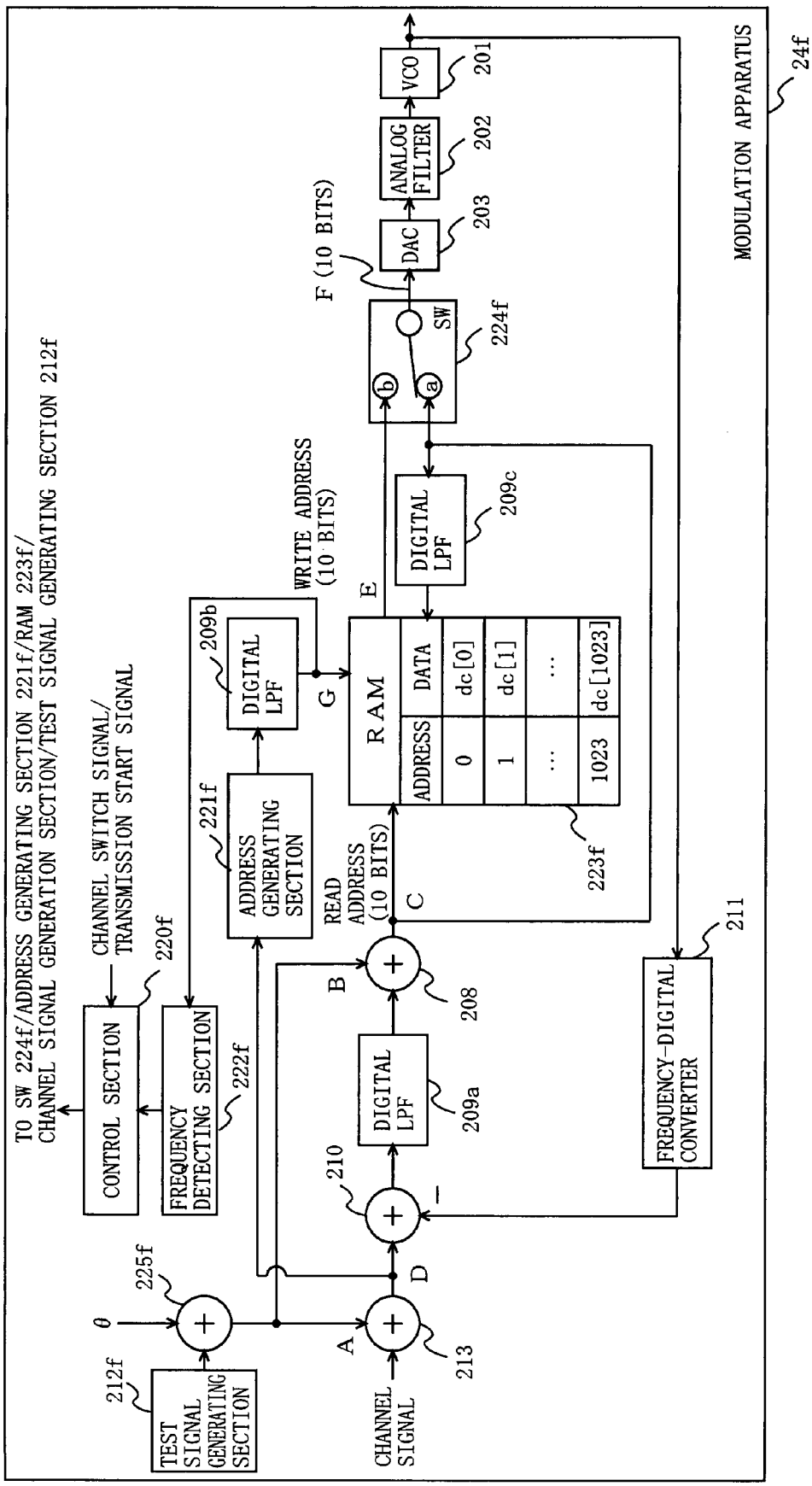
FIG. 15 is a diagram showing a configuration of a modulation apparatus 24$f$ according to a fourth embodiment of the present invention.

Next, a fourth embodiment which has a more specific configuration than that of the third embodiment will be described. FIG. 15 is a diagram showing a configuration of a modulation apparatus 24f according to a fourth embodiment of the present invention. In FIG. 15, parts similar to those of the first and second embodiments are indicated by the same reference numerals and will not be described. Also, the configurations of the communication terminal and the transmission apparatus are similar to those of the first embodiment, and therefore, FIGS. 1 and 2 will be referenced.

The modulation apparatus 24f includes a VCO 201, an analog filter 202, a DAC 203, a switch section 224f, a RAM 223f, an address generating section 221f, addition sections 208, 213 and 225f, digital LPFs 209a, 209b and 209c, a subtraction section 210, an FDC 211, a test signal generating section 212f, a frequency detecting section 222f, and a control section 220f.

A phase signal θ and a test signal which is output from the test signal generating section 212f are added together by the addition section 225f, though the phase signal θ and the test signal are basically input with different timing. The phase signal θ and the test signal are input to the addition sections 213 and 208. Therefore, a channel signal is modulated before and after the digital LPF 209a. Although the phase signal θ, the test signal, and the channel signal are described as 10-bit data, the present invention is not limited to this.

Firstly, an operation of the modulation apparatus 24f until a digital PLL circuit is locked to a desired frequency will be described. The control section 220f, when receiving a channel switch signal for switching channel frequencies, causes a channel signal generating section (not shown) to input a channel signal having a digital value corresponding to the desired frequency to the addition section 213. The control section 220f also switches the switch section 224f to a point-b direction. The channel signal is input via the subtraction section 210, the digital LPF 209a, and the addition section 208 to the RAM 223f. The RAM 223f is, for example, a dual-port RAM. The channel signal has a 10-bit digital value, and the digital value of the channel signal as it is serves as a read address for the RAM 223f. In an initial state, a digital value corresponding to an address is stored as data in the RAM 223f. Therefore, a read address (i.e., the digital value of the channel signal) is output, as it is, from a point E in FIG. 15. Thereafter, the digital value of the channel signal is also output to a point F in FIG. 15, and control voltage information corresponding to the digital value is input to the VCO 201. Thereafter, the output frequency of the VCO 201 is locked to the desired frequency by a feedback loop.

Figure 16A:
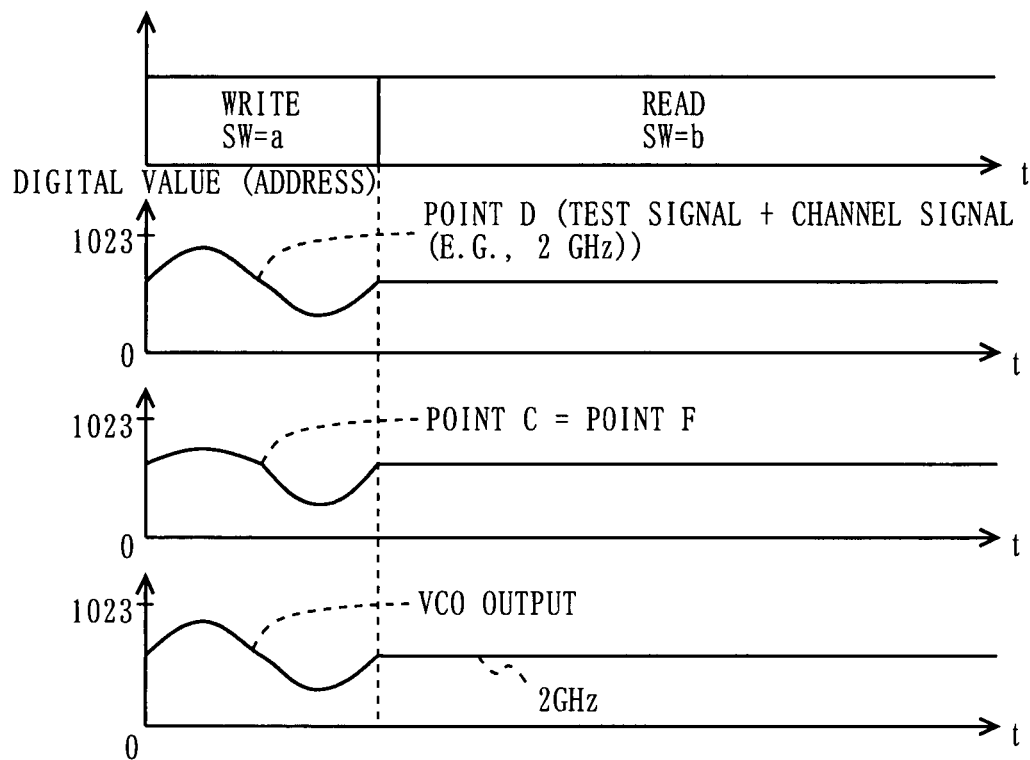
FIG. 16A is a diagram for describing an operation of the modulation apparatus 24$f$ after being locked.

FIG. 16A is a diagram for describing an operation of the modulation apparatus 24f after being locked. Hereinafter, an operation of the modulation apparatus 24f after being locked and then receiving a test signal will be described with reference to FIGS. 15 and 16A.

The control section 220f causes the test signal generating section 212f to generate a test signal and instructs the address generating section 221f to start writing a RAM. The control section 220f also switches a switch of the switch section 224f to a point-a direction. The test signal is input via the addition section 225f to the addition sections 213 and 208. The test signal is a signal having a frequency which falls within a loop band of the digital PLL circuit.

It is here assumed that the test signal is of 10 bits. The test signal changes a portion (e.g., −200 to 200, etc.) of digital values ranging from 0 to 1023 so that the frequency falls within the loop band. In FIG. 16A, it is assumed that the test signal has sine-curve variations. Variations in the digital value of the test signal appear at points A and B in FIG. 15. The digital value of the channel signal is a constant digital value, depending on characteristics of the VCO 201, when the channel frequency is assumed to be, for example, 2 GHz.

Here, desirably, the digital LPF 209b is connected between an output of the address generating section 221f and an input of the RAM 223f, and the digital LPF 209c is connected between a point a of the switch section 224f and an output of the RAM 223f. In general, in a phase signal which is being modulated, a frequency component higher than the PLL loop band of the digital PLL circuit as well as a frequency component lower than the PLL loop band may coexist. Therefore, by setting the digital LPFs 209b and 209c to have a cut-off frequency lower than about the loop band of the digital PLL circuit, writing to the RAM 223f can be performed using only a frequency lower than the PLL loop band. Therefore, the two digital LPFs 209b and 209c preferably have completely the same frequency characteristics (attenuation characteristics and phase characteristics).

The addition section 213 adds the channel signal and the test signal together and inputs the addition result to the subtraction section 210. Variations at a point D in FIG. 15 are, for example, as shown in FIG. 16A. The digital signal output from the addition section 208 is input via a point a of a switch section 224a to the DAC 203. Since the frequency of the test signal falls within the loop band, the output of the VCO 201 is not distorted by a digital value appearing at a point F in FIG. 15. Therefore, as shown in FIG. 16A, the VCO output varies in the form of a sine curve as with the test signal. In this case, a digital value appearing at a point C (i.e., the point F) in FIG. 15 is tracked and is therefore distorted with respect to a digital value appearing at the point D. The digital value appearing at the point C is stored into the RAM 223f. In this case, the address generating section 221f outputs the digital value at the point D as a write address to a point G in FIG. 15 and stores the digital value at the point C into the RAM 223f, corresponding to the write address at the point G. In the RAM 223f, an address is information about a control voltage before correction, while data is information about a control voltage after correction.

Therefore, the RAM 223f functions as a monitoring section for monitoring information about a control voltage when a test signal is input, and as a correction table storing section for associating information about the monitored control voltage with information (write address) about a control voltage before correction which is input from an address generating section 221 and storing the associated information as a correction table.

Next, an operation of the modulation apparatus 24f during modulation will be described with reference to FIGS. 15 and 16A. When modulation is started, a transmission start signal is input to the control section 220f. In response to this, the control section 220f switches the switch section 224f to the point-b direction. A phase signal θ is input via the addition section 225f to the addition sections 213 and 208. In this case, a digital value appearing at the point C in FIG. 15 is a value obtained by modulating a channel signal using the phase signal θ. Since the value at the point C is of 10 bits, the value is any value of 0 to 1023. The value at the point C, as it is, is a read address for the RAM 223f (information about a control voltage before correction). The RAM 223f outputs data corresponding to the read address to the point E in FIG. 15. The data output to the point E is information about a control voltage after correction. The data at the point E is converted into a control voltage, so that the VCO 201 is operated in a linear manner. Thus, the RAM 223f, the DAC 203, and the analog filter 202 function as a correction section for correcting a control voltage.

Figure 16B:
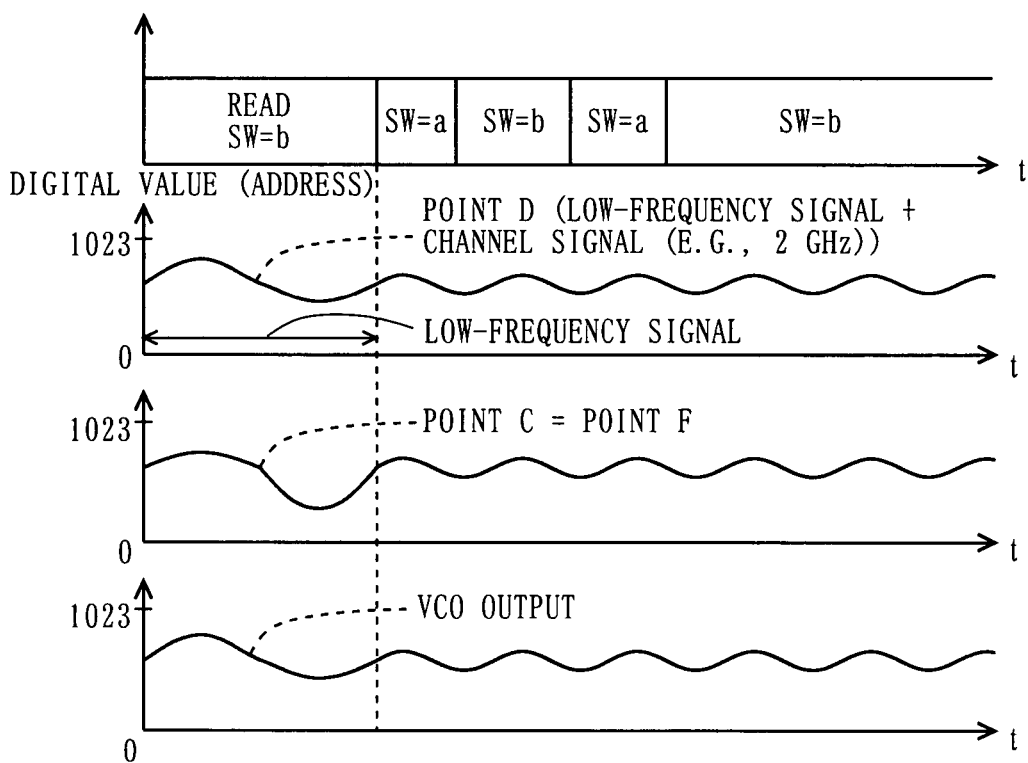
FIG. 16B is a diagram for describing an operation of the modulation apparatus 24$f$ when a low-frequency signal is input during modulation.

FIG. 16B is a diagram for describing an operation of the modulation apparatus 24f when a low-frequency signal is input during modulation. The frequency detecting section 222f detects a variation in digital value of the phase signal θ to determine whether or not a low-frequency signal has been input. Specifically, the frequency detecting section 222f differentiates the phase signal θ, and if the differentiated value is smaller than a predetermined value during a predetermined period, determines that a low-frequency signal has been input. Note that the frequency detecting section 222f may detect a variation in digital value at point D in FIG. 15 to determine whether or not a low-frequency signal has been input.

During a period in the switch section 224f is switched to the point-b direction, a memory circuit (not shown, equivalent to a cache section) existing from the point C of FIG. 15 to the RAM 223f temporarily stores a digital value at the point C and a write address from the address generating section 221f during the predetermined period. This memory circuit functions as a monitoring section and a cache section. A digital value at the point C during a period in which a low-frequency signal is input is control voltage information for causing the VCO 201 to be operated in a linear manner.

After the input of the low-frequency signal continues for a predetermined period, the control section 220f switches the switch section 224f to the point-a direction and writes the temporarily stored digital value into the RAM 223f. Thereby, the correction table is updated. In this case, in order not to access an address which is being read, the control section 220f adjusts write timing as required. Therefore, as shown in FIG. 16B, the switch section 224f is switched as required. For example, as a cache section, a memory corresponding to a sampling number during the predetermined period for determining a low-frequency signal may be prepared as the memory circuit.

After a read address is designated for the RAM 223f, a digital value corresponding to the designated read address may be read from the memory and written into the RAM 223f (timing adjustment) during a time until the next read address is designated for the RAM 223f. Also, by adjustment, such as increasing the number of times of a write operation during a read operation, decreasing the sampling number for determining a low-frequency signal, or the like, the capacitance of a memory circuit which should be prepared as a cache section can be reduced. By these adjustments, the memory circuit can be implemented not only by a memory, such as an SRAM or the like, but also by a temporary memory element, such as a D flip-flop, a buffer or the like. Thus, rewrite of the RAM 223f can be achieved by an appropriate design.

After the correction table is updated, the control section 220f switches the switch section 224f to the point-b direction. Thereafter, the control voltage information is corrected again based on the correction table stored in the RAM 223f, thereby achieving the linearity of the VCO 201.

Note that, in the fourth embodiment, the correction table may be produced only during a plateau period as in the first embodiment or only during a modulation period as in the second embodiment. In these cases, the configuration of the modulation apparatus 24f is achieved by the presence or absence of the test signal generating section 212f and the frequency detecting section 222f.

As described above, according to the modulation apparatus 24f of the fourth embodiment of the present invention, the RAM 223f stores control voltage information at the point C during a period in which a low-frequency signal is input, using a digital value obtained by adding a digital value of a channel signal to a digital value of the low-frequency signal as read and write addresses. Thereby, it is possible to monitor control voltage information, produce and store a correction table, and correct control voltage information.

Specifically, by using information about a control voltage before correction as a write address for the RAM 223f, monitoring of control voltage information and production of a correction table are achieved. By using information about a control voltage before correction as a read address for the RAM 223f, correction of control voltage information is achieved. Thus, by a simple configuration using the RAM 223f, the monitoring section, the correction table storing section, and the correction section are implemented.

For example, by using a digital value obtained by adding a digital value of a channel signal to a digital value of a test signal as information about a control voltage before correction, and using a digital value after the addition as an address for the RAM 223f, a memory area for storing the information about a control voltage before correction can be reduced. As a result, the cost of the modulation apparatus can be reduced, and the miniaturization of the modulation apparatus can be achieved.

Note that, also in the fourth embodiment, the variations indicated in the first to third embodiments can be similarly applied.

Fifth Embodiment

Figure 17:
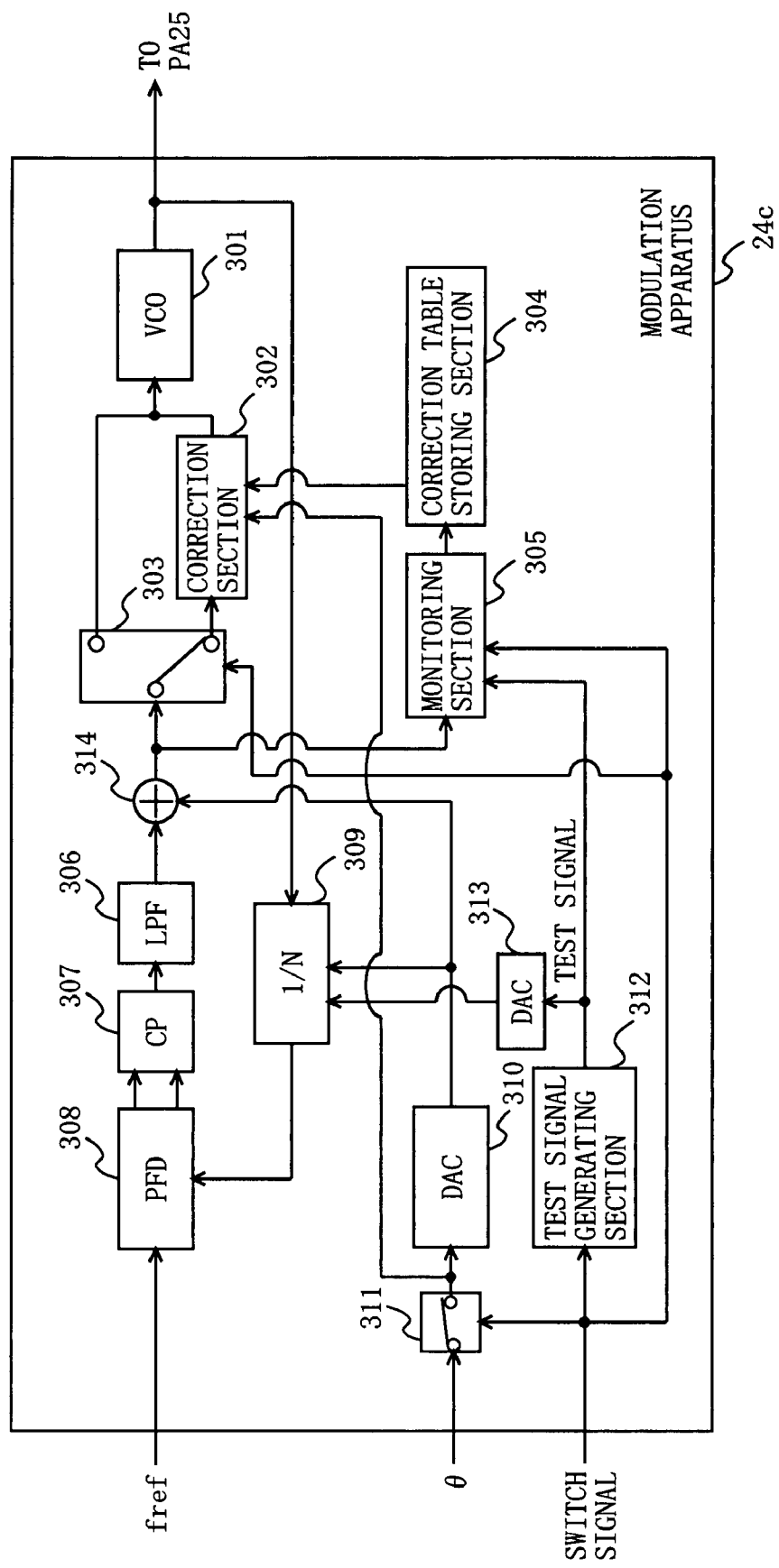
FIG. 17 is a diagram showing a configuration of a modulation apparatus 24$c$ according to a fifth embodiment of the present invention.

FIG. 17 is a diagram showing a configuration of a modulation apparatus 24c according to a fifth embodiment of the present invention. The configurations of the communication terminal and the transmission apparatus are similar to those of the first embodiment, and therefore, FIGS. 1 and 2 will be referenced. In FIG. 17, the modulation apparatus 24c comprises a VCO 301, a correction section 302, a switch section 303, a correction table storing section 304, a monitoring section 305, an LPF 306, a charge pump 307, a phase comparator 308, a frequency divider 309, a DAC 310, a switch section 311, a test signal generating section 312, a DAC 313, and an addition section 314. An analog PLL circuit is comprised of a feedback loop from the phase comparator 308 to the VCO 301 and the frequency divider 309.

When the analog PLL circuit is locked, the switch section 303 is switched to connect the VCO 301 and the addition section 314. An output signal from the VCO 301 is frequency-divided by the frequency divider 309 and is compared with a phase of a reference signal fref by the phase comparator 308. The comparison result is input as a control voltage via the charge pump 307 and the LPF 306 to the VCO 301. By this feedback loop, the frequency of the output signal from the VCO 301 is locked.

After the analog PLL circuit is locked, a switch signal is input to the modulation apparatus 24c. When receiving the switch signal, the test signal generating section 312 generates a test signal which is a low-frequency signal having a frequency falling within a loop band of the analog PLL circuit. The test signal has a feature similar that which has been described in the first embodiment. The switch section 311, when receiving a switch signal, goes to the OFF state. The switch section 303, when receiving a switch signal, is switched to connect the VCO 301 and the addition section 314.

The test signal is converted into a digital signal by the DAC 313, and the result is input to the frequency divider 309 before the LPF 306. The digital signal is equivalent to the test signal, and therefore, the test signal may be assumed to be input before the LPF 306. The frequency divider 309 changes the frequency division ratio based on this digital signal. Thereby, modulation is performed using the test signal. Since the frequency of the test signal falls within a lock band, the analog PLL circuit remains in the tracking state. Therefore, the output signal of the VCO 301 is not distorted. Therefore, based on a principle similar to that of the first embodiment, a correction table can be produced by monitoring information about a control voltage of the VCO 301.

Specifically, in the fifth embodiment, since the analog PLL circuit is used, the control voltage information which is information about a control voltage applied to the VCO 301, is equivalent to a control voltage obtained after an adder 314. Therefore, the monitoring section 305 monitors the control voltage, as it is, as the control voltage information. The monitoring section 305 converts the monitored control voltage information into a digital value, which is information about a control voltage after correction. Also, the monitoring section 305, when the control voltage information has been obtained, uses a digital value of the test signal input from the test signal generating section 312, as information about a control voltage before correction. The monitoring section 305 associates the information after correction with the information before correction to produce a correction table and stores the correction table into the correction table storing section 304. As in the first embodiment, the correction table is produced during any period in which the test signal is being generated. When the input of the switch signal is ended, the generation of the test signal is interrupted.

When a modulation period arrives, the switch section 303 is switched to connect the correction section 302 and the addition section 314. Also, the switch section 311 goes to the ON state. A phase signal θ is converted into an analog value by the DAC 310, and the analog value is input to the frequency divider 309 and the adder 314. Specifically, in the analog PLL circuit, a signal propagating though the analog PLL circuit is changed by the frequency divider 309 before the LPF 306, and the signal propagating in the analog PLL circuit is changed by the addition section 314 after the LPF 306. Therefore, phase modulation using the two-point modulation method is achieved. Thereby, broad-band phase modulation can be achieved.

The phase signal θ is also input to the correction section 302. The correction section 302 obtains information about a control voltage after correction corresponding to the digital value of the input phase signal θ (information about a control voltage before correction), by referencing the correction table, and corrects a control voltage based on the information about a control voltage after correction and applies the resultant control voltage to the VCO 301. Thereby, the VCO 301 can output an output signal without a distortion.

As described above, according to the modulation apparatus 24c of the fifth embodiment of the present invention, a test signal having a frequency within a loop band is used to produce a correction table so as to correct a control voltage. Thereby, a distortion in an output signal can be prevented, and the non-linearity of a VCO can be simply and quickly corrected without using an advanced digital signal processing technique.

Note that, also in the fifth embodiment, the variation indicated in the first embodiment can be similarly applied.

Sixth Embodiment

Figure 18:
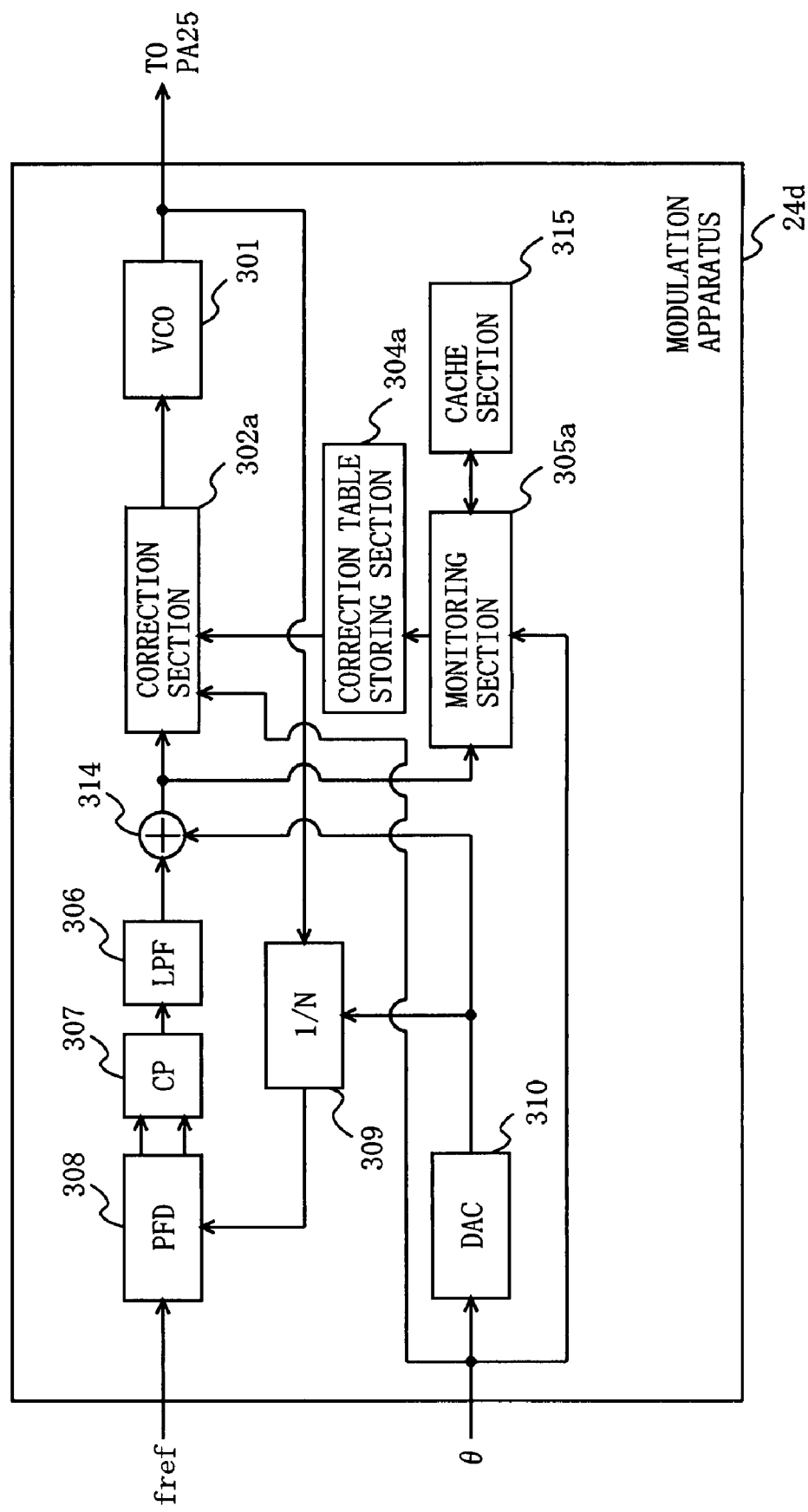
FIG. 18 is a diagram showing a configuration of a modulation apparatus 24$d$ according to a sixth embodiment of the present invention.

FIG. 18 is a diagram showing a configuration of a modulation apparatus 24d according to a sixth embodiment of the present invention. In FIG. 18, parts having functions similar to those of the fifth embodiment are indicated by the same reference numerals and will not be described. The configurations of the communication terminal and the transmission apparatus are similar to those of the first embodiment, and therefore, FIGS. 1 and 2 will be referenced.

In the sixth embodiment, as in the second embodiment, a correction table is produced during a modulation period. Specifically, a monitoring section 305a monitors a frequency at which a phase signal θ varies, and causes a cache section to temporarily store a digital value of the phase signal θ and a digital value of a control voltage (control voltage information). When the frequency of the variation of the phase signal θ is within a loop band during a predetermined period, the monitoring section 305a produces a correction table using the digital value of the phase signal θ temporarily stored in the cache section 315 as information about a control voltage before correction, and the digital value of the control voltage as information about a control voltage after correction, and stores the correction table into a correction table storing section 304a. The correction section 302 corrects a control voltage with reference to the correction table based on the digital value of the phase modulation signal θ, and applies the result to the VCO 301. The other operations are similar to those of the second embodiment.

As described above, according to the modulation apparatus 24d of the sixth embodiment of the present invention, even when an analog PLL circuit is used, it is possible to produce a correction table while transmission is being performed. Therefore, as in the second embodiment, the time-varying characteristics of the VCO 301 can be corrected as required.

Note that, also in the sixth embodiment, the variation described in the second embodiment can be similarly applied.

Seventh Embodiment

Figure 19:
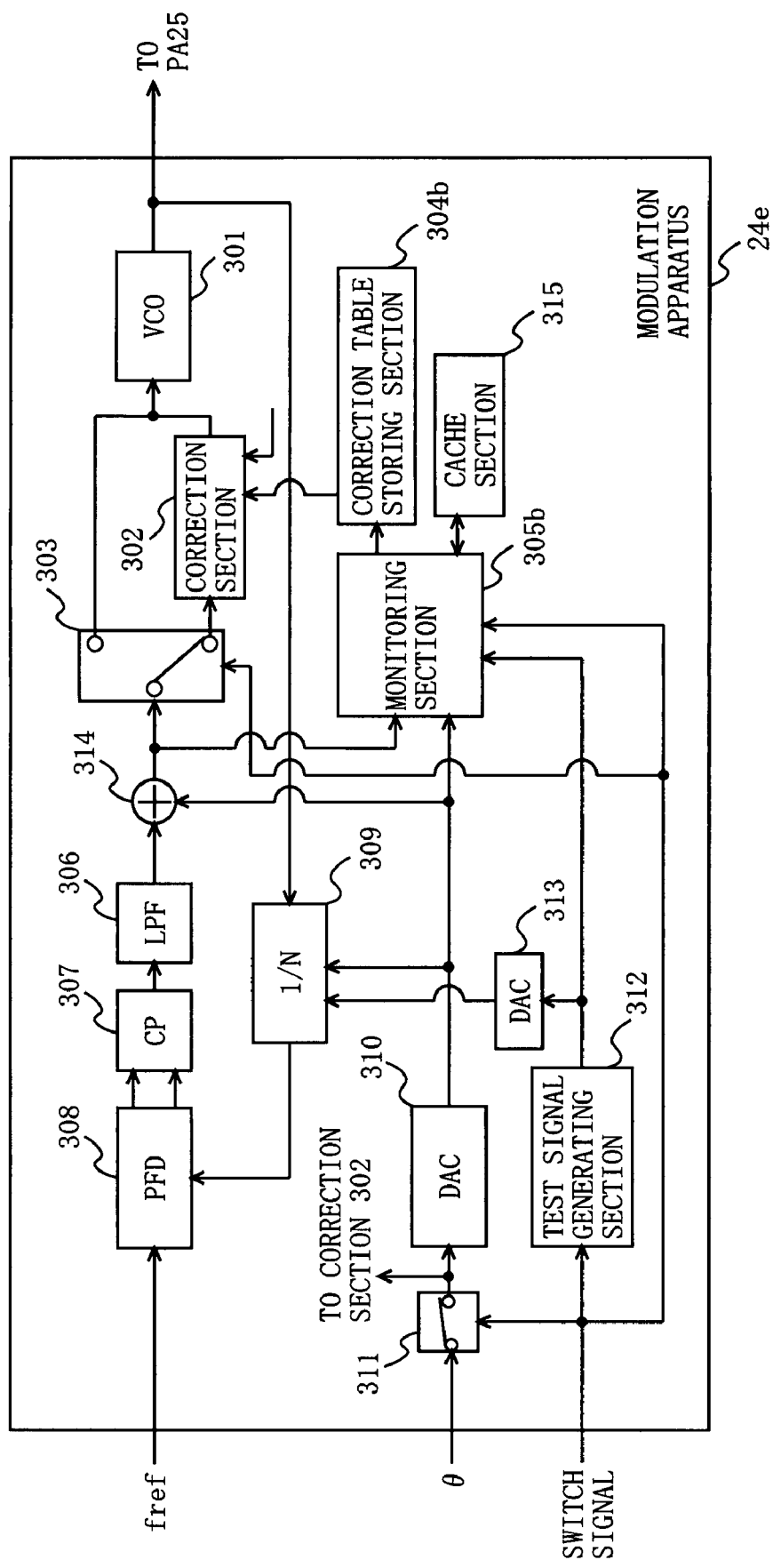
FIG. 19 is a diagram showing a configuration of a modulation apparatus 24$e$ according to a seventh embodiment of the present invention.
Figure 20:
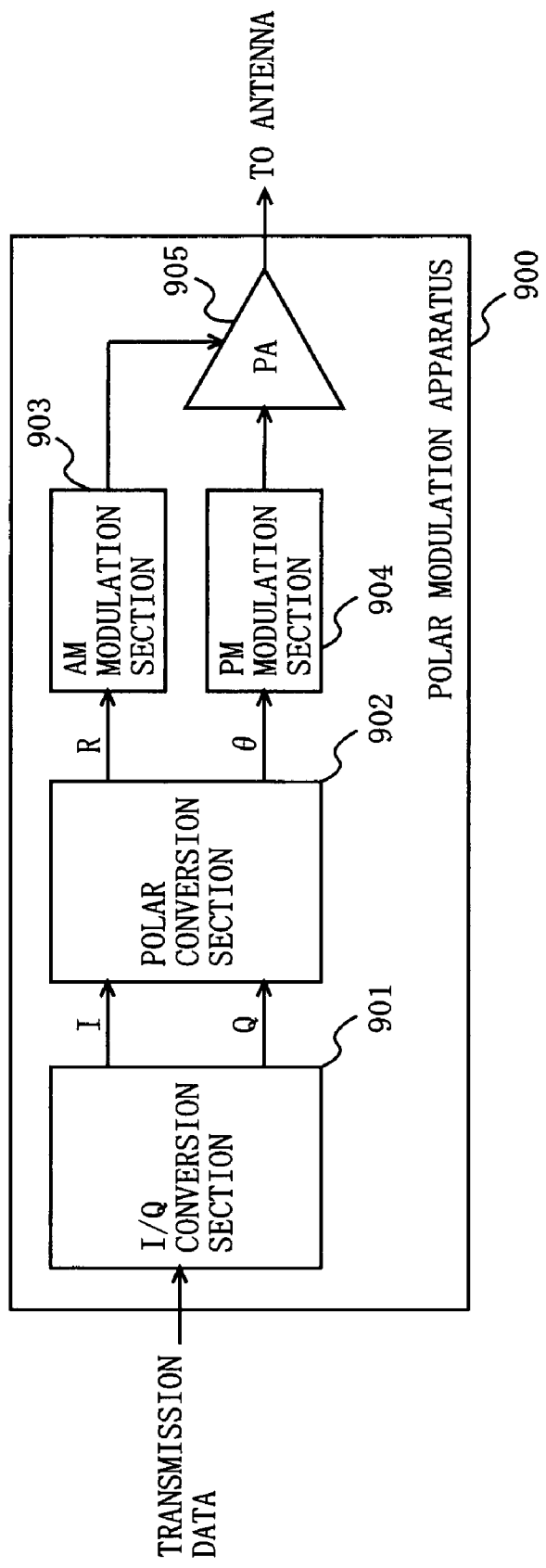
FIG. 20 is a block diagram showing an exemplary functional configuration of a polar modulation apparatus 900 used in a transmission apparatus of a conventional polar modulation system.
Figure 21:
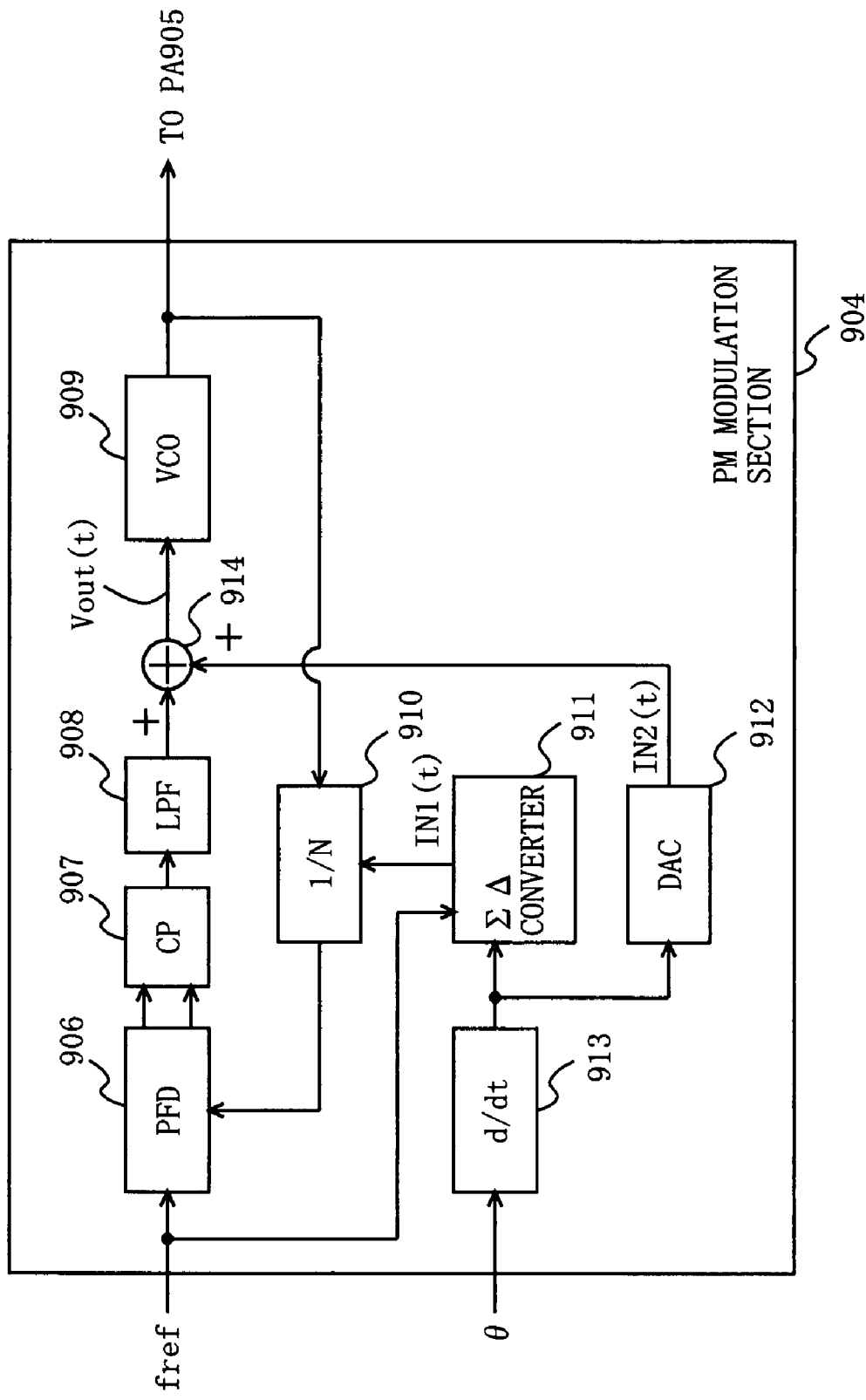
FIG. 21 is a diagram showing a detailed exemplary configuration of a conventional PM modulation section 904 employing the two-point modulation method.
Figure 22A:
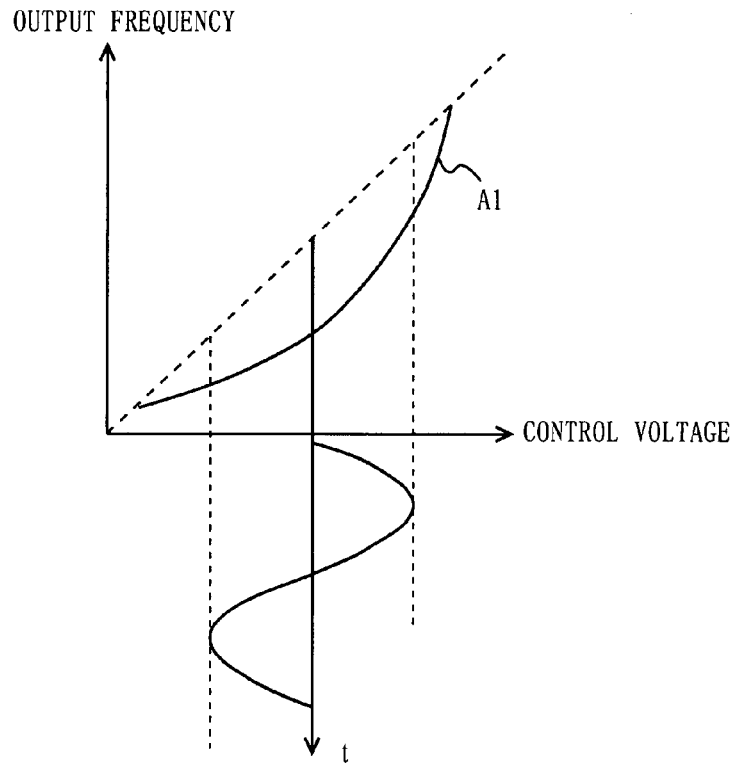
FIGS. 22A to 22C are diagrams for describing a conventional technique of calculating inverse characteristics of a VCO to correct a control voltage.
Figure 22B:
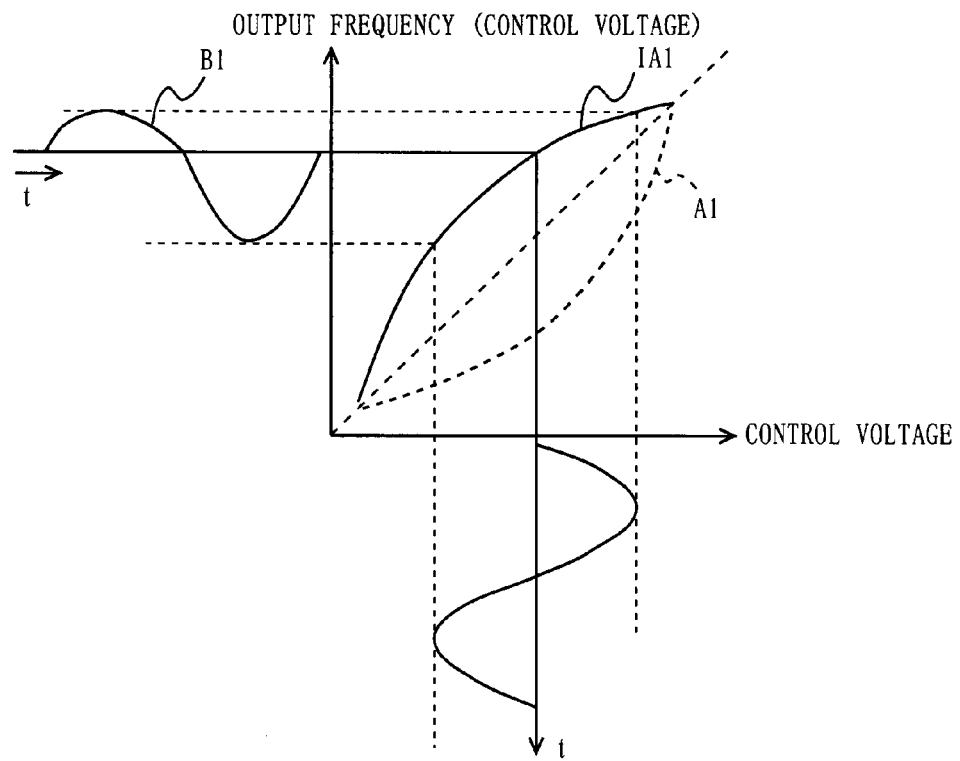
Figure 22C:
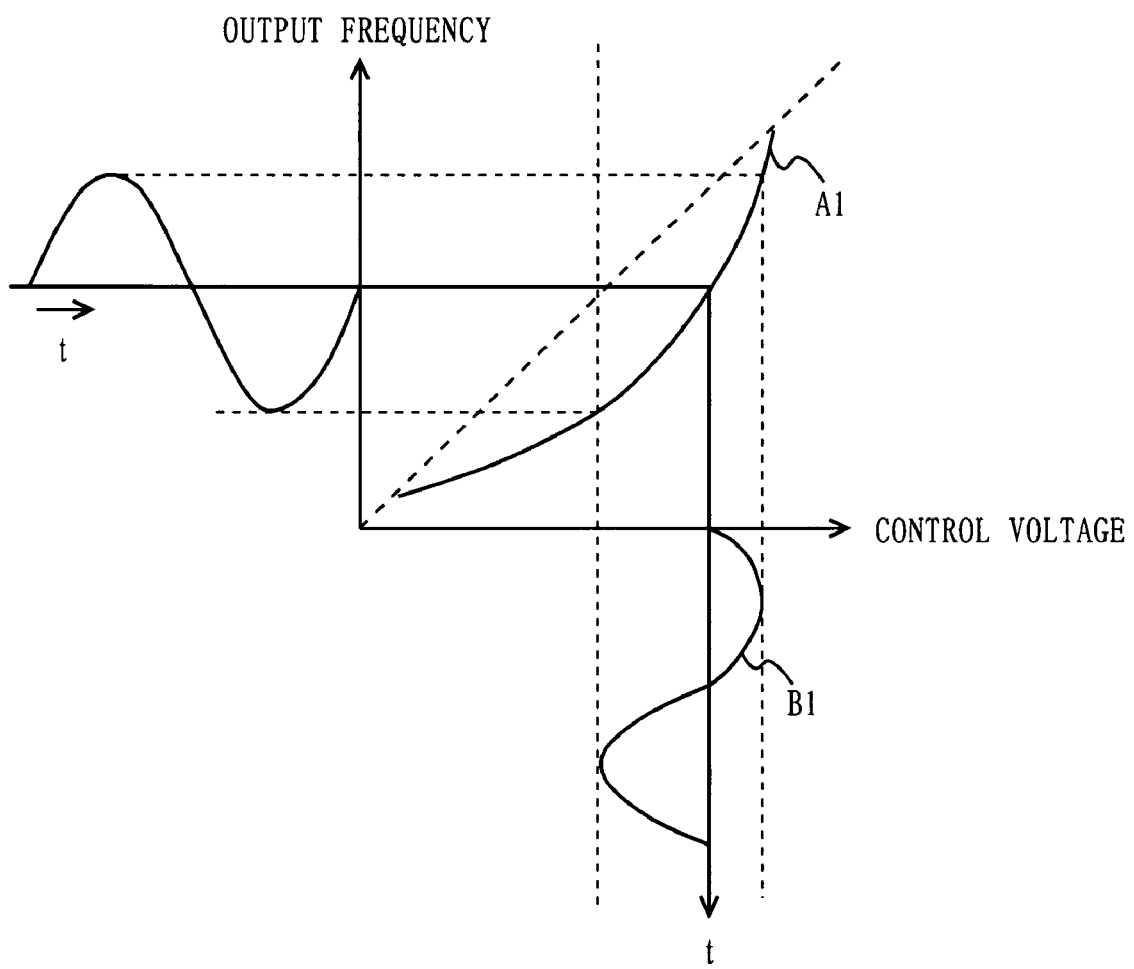

FIG. 19 is a diagram showing a configuration of a modulation apparatus 24e according to a seventh embodiment of the present invention. In FIG. 19, parts having functions similar to those of the fifth and sixth embodiments are indicated by the same reference numerals and will not be described. The configurations of the communication terminal and the transmission apparatus are similar to those of the first embodiment, and therefore, FIGS. 1 and 2 will be referenced.

In the seventh embodiment, as in the fifth embodiment, a monitoring section 305b produces a correction table based on a test signal during a plateau period and stores the correction table into a correction table storing section 304b. Further, when a low-frequency signal has been detected during a modulation period, a correction table is produced to update the correction table stored in the correction table storing section 304b as in the sixth embodiment.

As described above, according to the modulation apparatus 24e of the seventh embodiment of the present invention, as in the third embodiment, correction is achieved, depending on the time-varying characteristics of the VCO 201.

Note that, also in the seventh embodiment, the variation described in the third embodiment can be similarly applied.

Note that, in the first to seventh embodiments, the correction section, the correction table storing section, and the monitoring section collectively function as a correction apparatus capable of correcting the non-linearity of the VCOs 201 and 301.

While the invention has been described in detail, the foregoing description is in all aspects illustrative and not restrictive. It is understood that numerous other modifications and variations can be devised without departing from the scope of the invention.

What is claimed is:

1. A modulation apparatus for modulating a phase of an output signal that is output from a voltage controlled oscillator by changing a signal transmitted through a PLL circuit before and after a low-pass filter in the PLL circuit, the modulation apparatus comprising:

a monitoring section operable to monitor, after the low-pass filter, control voltage information about a control voltage applied to the voltage controlled oscillator, during any period, when a test signal having a frequency lower than or equal to a frequency band in which a loop gain of the PLL circuit is 0 dB is input at least before the low-pass filter;

a correction table storing section operable to associate control voltage information after correction and control voltage information before correction, and store corresponding control voltage information after correction and control voltage information before correction in a correction table, wherein the control voltage information after correction is the control voltage information monitored by the monitoring section and the control voltage information before correction is information about a control voltage applied to the low-pass filter; and a correction section operable to correct the control voltage applied to the voltage controlled oscillator based on the correction table stored in the correction table storing section.

2. The modulation apparatus according to claim 1, wherein the correction table is produced when the PLL circuit is in a locked state.

3. The modulation apparatus according to claim 2, wherein the PLL circuit is a digital PLL circuit, the modulation apparatus further comprises a test signal generating section operable to output the test signal, which is digital, during a predetermined period, when the PLL circuit is in the locked state, the monitoring section monitors a digital value of the control voltage information during any period in which the test signal is being output, and the control voltage after correction is the digital value monitored by the monitoring section and the control voltage before correction is a digital value obtained by adding a digital value of a channel signal to a digital value of the test signal.

4. The modulation apparatus according to claim 3, wherein the digital value of the test signal is changed so that a signal in a frequency band used for modulation is output by the voltage controlled oscillator.

5. The modulation apparatus according to claim 1, wherein the correction table is produced during a period in which transmission is being performed.

6. The modulation apparatus according to claim 5, wherein the PLL circuit is a digital PLL circuit, the correction table storing section stores the correction table during a period in which the test signal monitored by the monitoring section is input, and the control voltage information after correction is a digital value of the control voltage during the period, and the control voltage information before correction is a digital value of the test signal.

7. The modulation apparatus according to claim 1, wherein the correction table is produced during any period in which the PLL circuit is in a locked state, and may be updated during a period in which transmission is being performed.

8. The modulation apparatus according to claim 7, wherein the PLL circuit is a digital PLL circuit, the modulation apparatus further comprises a test signal generating section operable to output the test signal, which is digital, during a predetermined period, when the PLL circuit is in the locked state, the monitoring section monitors a digital value of the control voltage information during any period in which the test signal is being output, the control voltage after correction is the digital value monitored by the monitoring section and the control voltage before correction is a digital value obtained by adding a digital value of a channel signal to a digital value of the test signal, and the monitoring section further, during any period in which the test signal is input, updates the correction table, wherein, in an updated correction table, the control voltage after correction is a digital value of the control voltage information during the, and the control voltage before correction is a digital value of the test signal.

9. The modulation apparatus according to claim 1, further comprising:

a test signal generating section operable to output the test signal during a predetermined period, when the PLL circuit is in a locked state; and a loop band changing section operable to change the loop band, wherein the test signal generating section changes a frequency of the test signal, depending on a loop band.

10. The modulation apparatus according to claim 1, wherein the PLL circuit is a digital PLL circuit, and the monitoring section, the correction table storing section, and the correction section are comprised of RAM for storing the control voltage information during a period in which the test signal is being input, wherein the control voltage information comprises a digital value obtained by adding a digital value of a channel signal to a digital value of the test signal, and is used as a read or write address for RAM.

11. A transmission apparatus for polar-modulating and transmitting digital transmission data, the transmission apparatus comprising:

an I/Q conversion section operable to convert the transmission data into an in-phase component and a quadrature component;

a polar conversion section operable to convert the in-phase component and the quadrature component obtained by the I/Q conversion section into an amplitude component and a phase component;

an AM modulation section operable to convert the amplitude component into an analog signal;

a modulation section operable to phase-modulate a channel signal to be used as a reference, based on the phase component; and a power amplifier operable to modulate a signal that is output from the modulation section using a signal that is output from the AM modulation section and to output a transmission signal, wherein the modulation section modulates a phase of an output signal output from a voltage controlled oscillator by changing a signal transmitted through a PLL circuit, before and after a low-pass filter in the PLL circuit, the modulation section comprising:

a monitoring section operable to monitor, after the low-pass filter, control voltage information about a control voltage applied to the voltage controlled, during any period, when a test signal having a frequency lower than or equal to a frequency band in which the loop gain of the PLL circuit is 0 dB is input at least before the low-pass filter;

a correction table storing section operable to associate control voltage information after correction and control voltage information before correction, and store corresponding control voltage information after correction and control voltage information before correction in a correction table, wherein the control voltage information after correction is the control voltage information monitored by the monitoring section and the control voltage information before correction is information about a control voltage applied to the low-pass filter; and a correction section operable to correct the control voltage applied to the voltage controlled oscillator based on the correction table stored in the correction table storing section.

12. A communication terminal comprising a transmission apparatus for polar-modulating and transmitting digital transmission data, wherein the transmission apparatus comprises:
an I/Q conversion section operable to convert the transmission data into an in-phase component and a quadrature component;
a polar conversion section operable to convert the in-phase component and the quadrature component obtained by the I/Q conversion section into an amplitude component and a phase component;
an AM modulation section operable to convert the amplitude component into an analog signal;
a modulation section operable to phase-modulate a channel signal to be used as a reference, based on the phase component; and
a power amplifier operable to modulate a signal output from the modulation section using a signal output from the AM modulation section to output a transmission signal, and
the modulation section modulates a phase of an output signal output from a voltage controlled oscillator by changing a signal transmitted through a PLL circuit, before and after a low-pass filter in the PLL circuit, the modulation section comprising:
a monitoring section operable to monitor, after the low-pass filter, control voltage information about a control voltage applied to the voltage controlled oscillator, during any period, when a test signal having a frequency lower than or equal to a frequency band in which a loop gain of the PLL circuit 0 dB is input at least before the low-pass filter;
a correction table storing section operable to associate control voltage information after correction and control voltage information before correction, and store corresponding control voltage information after correction and control voltage information before correction in a correction table, wherein the control voltage information after correction is the control voltage information monitored by the monitoring section and the control voltage information before correction is information about a control voltage applied to the low-pass filter; and
a correction section operable to correct the control voltage applied to the voltage controlled oscillator based on the correction table stored in the correction table storing section.

13. A correction apparatus for correcting the non-linearity of a voltage controlled oscillator used in a PLL circuit, wherein the PLL circuit changes a phase of an output signal that is output from a voltage controlled oscillator by changing a signal transmitted through the PLL circuit, before and after a low-pass filter in the PLL circuit, the correction apparatus comprising:
a monitoring section operable to monitor, after the low-pass filter, control voltage information about a control voltage applied to the voltage controlled oscillator, during any period, when a test signal having a frequency lower than or equal to a frequency band in which the loop gain of the PLL circuit is 0 dB is input at least before the low-pass filter;
a correction table storing section operable to associate control voltage information after correction and control voltage information before correction, and store corresponding control voltage information after correction and control voltage information before correction in a correction table, wherein the control voltage information after correction is the control voltage information monitored by the monitoring section and the control voltage information before correction is information about a control voltage applied to the low-pass filter; and
a correction section operable to correct the control voltage applied to the voltage controlled oscillator based on the correction table stored in the correction table storing section.

14. A PLL circuit for changing a phase of an output signal that is output from a voltage controlled oscillator by changing a transmitting signal, before and after a low-pass filter, the PLL circuit comprising:
a monitoring section operable to monitor, after the low-pass filter, control voltage information about a control voltage applied to the voltage controlled oscillator, during any period, when a test signal having a frequency lower than or equal to a frequency band in which a loop gain of the PLL circuit is 0 dB is input at least before the low-pass filter;
a correction table storing section operable to associate control voltage information after correction and control voltage information before correction, and store corresponding control voltage information after correction and control voltage information before correction in a correction table, wherein the control voltage information after correction is the control voltage information monitored by the monitoring section and the control voltage information before correction is information about a control voltage applied to the low-pass filter; and
a correction section operable to correct the control voltage applied to the voltage controlled oscillator based on the correction table stored in the correction table storing section.

15. A method for modulating a phase of an output signal output from a voltage controlled oscillator by changing a signal transmitted through a PLL circuit, before and after a low-pass filter in the PLL circuit, comprising the steps of:
monitoring, after the low-pass filter, control voltage information about a control voltage applied to the voltage controlled oscillator, during any period, when a test signal having a frequency lower than or equal to a frequency band in which a loop gain of the PLL circuit is 0 dB is input at least before the low-pass filter;
associating control voltage information after correction and control voltage information before correction, wherein the control voltage information after correction is the control voltage information monitored by the monitoring section and the control voltage information before correction is information about a control voltage applied to the low-pass filter;
storing corresponding control voltage information after correction and control voltage information before correction in a correction table; and
correcting a control voltage applied to the voltage controlled oscillator based on the correction table.

16. A method for correcting the non-linearity of a voltage controlled oscillator in a PLL circuit for changing a phase of an output signal output from voltage controlled oscillator by changing a transmitting signal, before and after a low-pass filter, the method comprising the steps of:
monitoring, after the low-pass filter, control voltage information about a control voltage applied to the voltage controlled oscillator, during any period, when a test signal having a frequency lower than or equal to a frequency band in which a loop gain of the PLL circuit is 0 dB is input at least before the low-pass filter;
associating control voltage information after correction and control voltage information before correction, wherein the control voltage information after correction is the control voltage information monitored by the monitoring section and the control voltage information before correction is information about a control voltage applied to the low-pass filter;

storing corresponding control voltage information after correction and control voltage information before correction in a correction table; and correcting a control voltage applied to the voltage controlled oscillator based on the correction table.

* * * * *